US008564701B2

(12) United States Patent
Watanabe et al.

(10) Patent No.: US 8,564,701 B2
(45) Date of Patent: Oct. 22, 2013

(54) SOLID-STATE IMAGING DEVICE HAVING A BURIED PHOTODIODE AND A BURIED FLOATING DIFFUSION POSITIONED FOR IMPROVED SIGNAL CHARGE TRANSFER, AND ELECTRONIC APPARATUS INCLUDING THE SOLID-STATE IMAGING DEVICE

(75) Inventors: Taiichiro Watanabe, Kanagawa (JP);
Kazufumi Watanabe, Kanagawa (JP)

(73) Assignee: Sony Corporation (JP)

( * ) Notice: Subject to any disclaimer, the term of this patent is extended or adjusted under 35 U.S.C. 154(b) by 445 days.

(21) Appl. No.: 12/839,440

(22) Filed: Jul. 20, 2010

(65) Prior Publication Data

US 2011/0019063 A1 Jan. 27, 2011

(30) Foreign Application Priority Data

Jul. 27, 2009 (JP) ................................. 2009-174578

(51) Int. Cl.
*H04N 3/14* (2006.01)
*H04N 5/335* (2011.01)

(52) U.S. Cl.
USPC ........................................................ 348/294

(58) Field of Classification Search
USPC .................... 348/294, 311; 257/216, 225, 233
See application file for complete search history.

(56) References Cited

U.S. PATENT DOCUMENTS

| 2005/0167704 A1* | 8/2005 | Ezaki et al. ................... 257/233 |
| 2006/0001061 A1* | 1/2006 | Miyatake et al. .............. 257/292 |
| 2007/0052056 A1* | 3/2007 | Doi et al. ....................... 257/462 |
| 2007/0184614 A1* | 8/2007 | Adkisson et al. ............. 438/259 |
| 2009/0303371 A1* | 12/2009 | Watanabe et al. ............. 348/311 |

FOREIGN PATENT DOCUMENTS

| JP | 2004-172950 | 6/2004 |
| JP | 2005-347325 | 12/2005 |
| JP | 2006-054276 | 2/2006 |
| JP | 2006-093319 | 4/2006 |
| JP | 2006-157953 | 6/2006 |
| JP | 2006-216577 | 8/2006 |
| JP | 2009-088447 | 4/2009 |

* cited by examiner

*Primary Examiner* — Gary C Vieaux
(74) *Attorney, Agent, or Firm* — Sheridan Ross P.C.

(57) ABSTRACT

A solid-state imaging device includes a pixel including a buried photodiode formed inside a substrate, a buried floating diffusion formed at a depth equal to that of the buried photodiode in the substrate so as to face a bottom of a trench portion formed in the substrate, and a buried gate electrode formed at the bottom of the trench portion in order to transfer a signal charge from the buried photodiode to the buried floating diffusion.

20 Claims, 33 Drawing Sheets

SOLID-STATE IMAGING DEVICE HAVING A BURIED PHOTODIODE AND A BURIED FLOATING DIFFUSION POSITIONED FOR IMPROVED SIGNAL CHARGE TRANSFER, AND ELECTRONIC APPARATUS INCLUDING THE SOLID-STATE IMAGING DEVICE

BACKGROUND OF THE INVENTION

1. Field of the Invention

The present invention relates to a solid-state imaging device, a method for manufacturing a solid-state imaging device, and an electronic apparatus including the solid-state imaging device.

2. Description of the Related Art

CMOS solid-state imaging devices include a plurality of pixels arranged in a desired pattern, the pixels each including a photodiode and a plurality of MOS transistors. The photodiode serves as a photoelectric transducer which generates signal charge according to a quantity of received light and stores the charge, and the plurality of MOS transistors serve as elements for transferring signal charge from the photodiode. In each of the pixels, signal charge is obtained by illuminating light and output as a pixel signal. The output pixel signal is processed by a predetermined signal processing circuit and output as a video signal to the outside.

In order to improve the characteristics of solid-state imaging devices, attempts have recently been made to reduce a pixel size and improve a quantity ($Q_s$) of saturation electric charge and sensitivity. Japanese Unexamined Patent Application Publication No. 2005-223084 discloses a solid-state imaging device using a transfer transistor having a vertical gate electrode which is formed in the depth direction of a semiconductor substrate in order to permit miniaturization of a pixel size without decreasing a quantity ($Q_s$) of saturation electric charge and sensitivity.

FIG. 33 shows a schematic sectional configuration of a related-art solid-state imaging device described in Japanese Unexamined Patent Application Publication No. 2005-223084.

As shown in FIG. 33, a solid-state imaging device 100 of this publication includes a p-type semiconductor substrate 101, a photodiode 104 formed in the semiconductor substrate 101 and constituting each pixel, and a transfer transistor Tra.

The photodiode 104 includes a p-type high-concentration impurity region (p+ region) 105 formed on the surface side of the semiconductor substrate 101, an n-type high-concentration impurity region (n+ region) 103 formed in contact with the p+ region 105, and an n-type low-concentration impurity region (n− region) 102. A main pn junction constituting the photodiode 104 is formed by a junction between the p+ region 105 and the n+ region 103.

The transfer transistor Tra is an n-channel MOS transistor for transferring signal charge stored in the photodiode 104. The transfer transistor Tra includes a floating diffusion portion 107 provided on the surface side of the semiconductor substrate 101 and a vertical gate electrode 108 formed from the surface side of the semiconductor substrate 101 in the depth direction through a gate insulating film 106. The vertical gate electrode 108 is in contact with the floating diffusion portion 107 with the gate insulating film 106 provided therebetween, and is formed to a position deeper than the pn junction of the photodiode 104. The vertical gate electrode 108 is formed by forming the gate insulating film 106 in a trench which is formed from the surface side of the semiconductor substrate 101 to a depth reaching the pn junction of the photodiode 104 and then filling a portion above the gate insulating film 106 in the trench.

In the transfer transistor Tra, a transfer channel is formed from the pn junction constituting the photodiode 104 to the floating diffusion portion 107 along the vertical gate electrode 108 in the depth direction of the semiconductor substrate 101.

In the solid-state imaging device 100 having the above-described configuration, light incident on the back side of the semiconductor substrate 101 is photoelectrically converted by the photodiode 104 to store signal charge in the photodiode 104. When a positive voltage is applied to the vertical gate electrode 108 of the transfer transistor Tra, the signal charge stored in the photodiode 104 is read out to the floating diffusion portion 107 through transfer paths shown by broken lines a in FIG. 33.

In the above-described configuration, the photodiode 104 is formed in the depth direction of the semiconductor substrate 101, and the signal charge stored in the photodiode 104 is read out by the vertical gate electrode 108. Therefore, miniaturization of the pixels does not decrease the quantity ($Q_s$) of saturation electric charge and sensitivity of the photodiode 104. In addition, a backside illumination type, a MOS transistor and a wiring layer are not formed on the illumination side, thereby increasing an opening area.

However, when the signal charge stored in the photodiode 104 which is buried in the semiconductor substrate 101 is read out from the inside of the semiconductor substrate 101 to the surface side thereof by the vertical gate electrode 108, the charge transfer path is very long as shown by the broken lines a. Therefore, complete transfer of signal charges is difficult as compared with a plane-type gate electrode used in usual solid-state imaging devices.

SUMMARY OF THE INVENTION

As described above, there has been proposed a configuration in which a photodiode is formed inside a semiconductor substrate in order to improve a quantity ($Q_s$) of saturation electric charge. However, in this case, a transfer path is made very long, and thus it is difficult to completely transfer signal charge.

In view of this point, it is desirable to provide a solid-state imaging device capable of good transfer of signal charge while maintaining a high quantity ($Q_s$) of saturation electric charge, and a method for manufacturing the same. Also it is desirable to provide an electronic apparatus using the solid-state imaging device.

A solid-state imaging device according to an embodiment of the present invention includes a pixel including a buried photodiode, a buried floating diffusion, and a buried gate electrode. The buried photodiode is formed inside a substrate. The buried floating diffusion is formed at a depth equal to that of the buried photodiode inside the substrate so as to face a bottom of a trench portion formed in the substrate. The buried gate electrode is formed at the trench portion in order to transfer signal charge from the buried photodiode to the buried floating diffusion.

In the solid-state imaging device, signal charge generated and stored in the buried photodiode is transferred to the buried floating diffusion by the buried gate electrode. Since the buried floating diffusion is formed at the depth equal to that of the buried photodiode, the signal charge is transferred through a short transfer path.

A method for manufacturing a solid-state imaging device according to an embodiment of the present invention includes the steps of preparing a substrate, forming a first trench portion with a desired depth in the substrate by etching a desired region of the substrate, forming a buried gate electrode at the bottom of the first trench portion through a gate insulating film, filling the first trench portion with an oxide film, forming a second trench portion aside of the first trench portion to a depth equal to that of the first trench portion by etching the substrate using as a mask a resist formed on the oxide film, forming a buried floating diffusion in a portion of the substrate, which faces the bottom of the second trench portion further formed aside of the first trench portion, by implanting impurity ions using the oxide film and the resist as a mask, and forming a buried photodiode by implanting desired impurity ions at a depth equal to that of the buried floating diffusion in the substrate before or after the formation of the trench portions.

A method for manufacturing a solid-state imaging device according to an embodiment of the present invention includes the steps of preparing a substrate, forming a buried gate electrode on the substrate through a gate insulating film, forming a buried floating diffusion in the substrate aside of the buried gate electrode by implanting desired impurity ions, forming a trench portion by selective epitaxial growth of a region of the substrate other than the region where the buried gate electrode and the buried floating diffusion are formed, and forming a buried photodiode aside of the buried gate electrode by implanting desired impurity ions in the substrate before the formation of the buried gate electrode or after the formation of the trench portion.

In the method for manufacturing a solid-state imaging device, the buried floating diffusion is formed at the same depth as the buried photodiode. In addition, the buried gate electrode is formed at the bottom of the trench portion, for transferring signal charge from the buried photodiode to the buried floating diffusion. As a result, signal charge generated and stored in the buried photodiode is transferred to the buried floating diffusion by the buried gate electrode. Since the buried floating diffusion is formed at a depth equal to that of the buried photodiode, the signal charge is transferred through a short transfer path.

An electronic apparatus according to an embodiment of the present invention includes an optical lens, the above-described solid-state imaging device on which light collected in the optical lens is incident, and a signal processing circuit configured to process signals output from the solid-state imaging device.

According to the present invention, it may be possible to achieve a solid-state imaging device capable of good transfer of signal charge while maintaining a high quantity of saturation electric charge. In addition, an electronic apparatus improved in image quality may be achieved using the solid-state imaging device.

DESCRIPTION OF THE PREFERRED EMBODIMENTS

Methods for manufacturing solid-state imaging devices according to embodiments of the present invention and an example of an electronic apparatus are described below with reference to FIGS. 1 to 32. The embodiments of the present invention are described in the order below. The present invention is not limited to these embodiments.

1. First Embodiment: Solid-State Imaging Device
1-1 Overall Configuration of Solid-State Imaging Device
1-2 Configuration of Principal Portion
2. Second Embodiment: Solid-State Imaging Device
3. Third Embodiment: Solid-State Imaging Device
3-1 Configuration of Principal Portion
3-2 Manufacturing Method (1)
3-3 Manufacturing Method (2)
4. Fourth Embodiment: Solid-State Imaging Device
5. Fifth Embodiment: Solid-State Imaging Device
6. Sixth Embodiment: Solid-State Imaging Device
7. Seventh Embodiment: Solid-State Imaging Device
8. Eighth Embodiment: Solid-State Imaging Device
9. Ninth Embodiment: Solid-State Imaging Device
10. Tenth Embodiment: Solid-State Imaging Device
11. Eleventh Embodiment: Electronic Apparatus

1. First Embodiment

Figure 1:
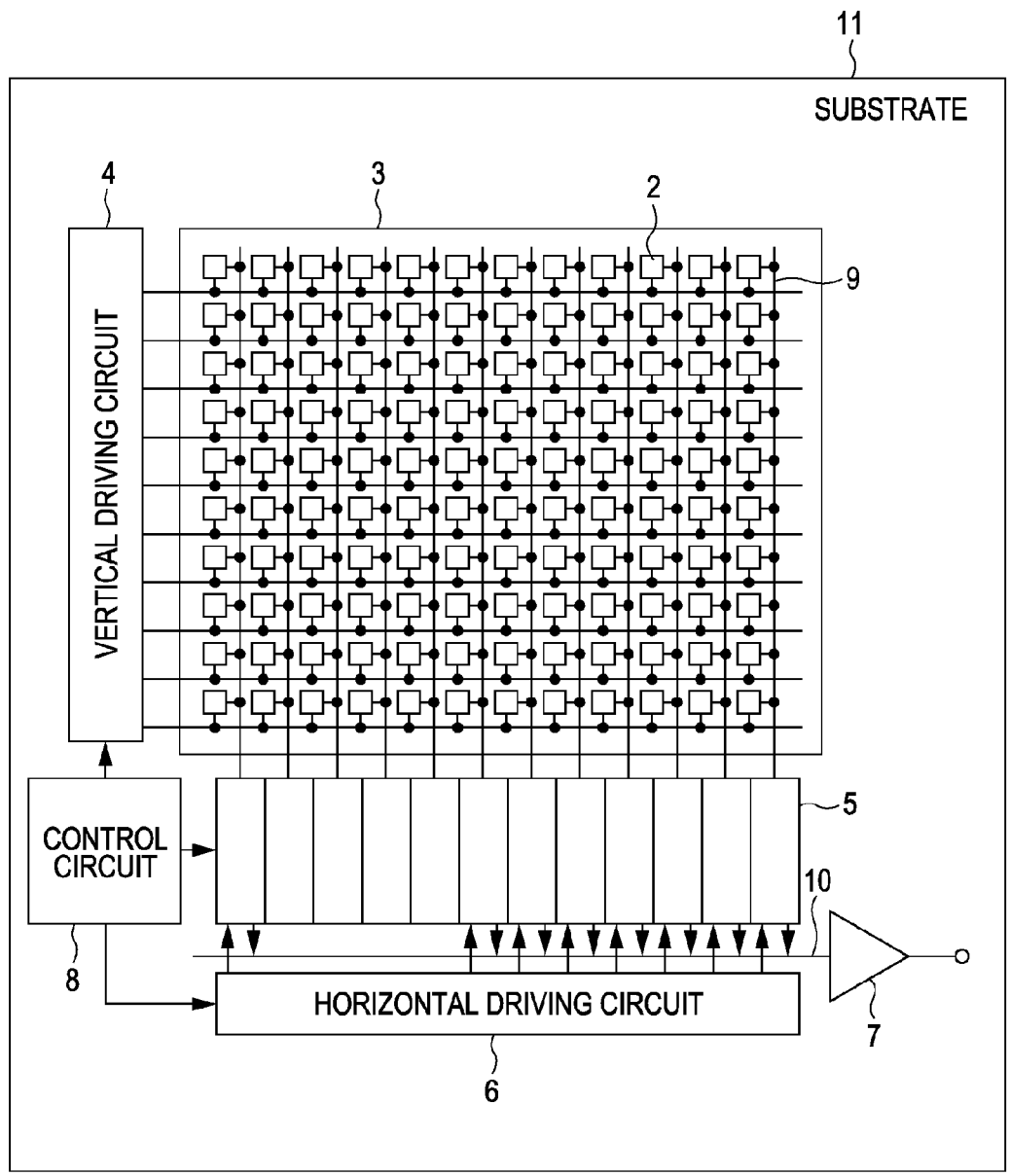
FIG. 1 is a schematic block diagram showing the whole of a CMOS solid-state imaging device according to a first embodiment of the present invention.

Solid-State Imaging Device 1-1 Overall Configuration of Solid-State Imaging FIG. 1 is a schematic block diagram showing the whole of a CMOS solid-state imaging device 1 according to a first embodiment of the present invention.

The solid-state imaging device 1 according to the first embodiment includes a pixel portion 3 including a plurality pixels 2 which are arranged on a substrate 11 composed of silicon, a vertical driving circuit 4, a column signal processing circuit 5, a horizontal driving circuit 6, an output circuit 7, a control circuit 8, and the like.

The plurality of pixels 2 each include a light-receiving portion composed of a photodiode and a plurality of MOS transistors, and are regularly arranged in a two-dimensional array on the substrate 11. The MOS transistors constituting each pixel 2 may be four transistors including a transfer transistor, a reset transistor, a selection transistor, and an amplifier transistor or the three transistors excluding the selection transistor.

The pixel portion 3 includes the plurality of pixels 2 which are regularly arranged in a two-dimensional array. The pixel portion 3 has an effective pixel region which signal charge produced by photoelectric conversion of actually received light is amplified and read out to the column signal processing circuit 5 and a black-reference pixel region (not shown) in which optical black as a black level reference is output. The black-reference pixel region is usually formed in the peripheral region of the effective pixel region.

The control circuit 8 generates a clock signal, a control signal, and the like as references of operations of the vertical driving circuit 4, the column signal processing circuit 5, the horizontal driving circuit 6, and the like on the basis of a vertical synchronizing signal, a horizontal synchronizing signal, and a master clock. The clock signal, the control signal, and the like generated in the control circuit 8 are input to the vertical driving circuit 4, the column signal processing circuit 5, the horizontal driving circuit 6, and the like.

The vertical driving circuit 4 includes, for example, a shift register, so that the pixels 2 of the pixel portion 3 are successively selectively scan in line units in the vertical direction. A pixel signal based on the signal charge produced in the photodiode of each of the pixels 2 according to the quantity of received light is supplied to the column signal processing circuit 5 through a corresponding vertical signal line.

The column signal processing circuit 5 is disposed, for example, for each column of the pixels 2, and performs, for each column of the pixels 2, signal processing such as noise removal, signal amplification, and the like of signals output from the pixels 2 of one line on the basis of a signal output from the black-reference pixel region (formed in the periphery of the effective pixel region, but not shown in the drawing). A horizontal selection switch (not shown) is provided between the output step of the column signal processing circuit 5 and a horizontal signal line 10.

The horizontal driving circuit 6 includes, for example, a shift register, so that the column signal processing circuits are successively selected by successively outputting horizontal scanning pulses, and a pixel signal is output to the horizontal signal line 10 from each of the column signal processing circuits 5.

The output circuit 7 processes signals successively supplied from the column signal processing circuit 5 through the horizontal signal line 10 and outputs the signals.

1-2 Configuration of Principal Portion

Figure 2:
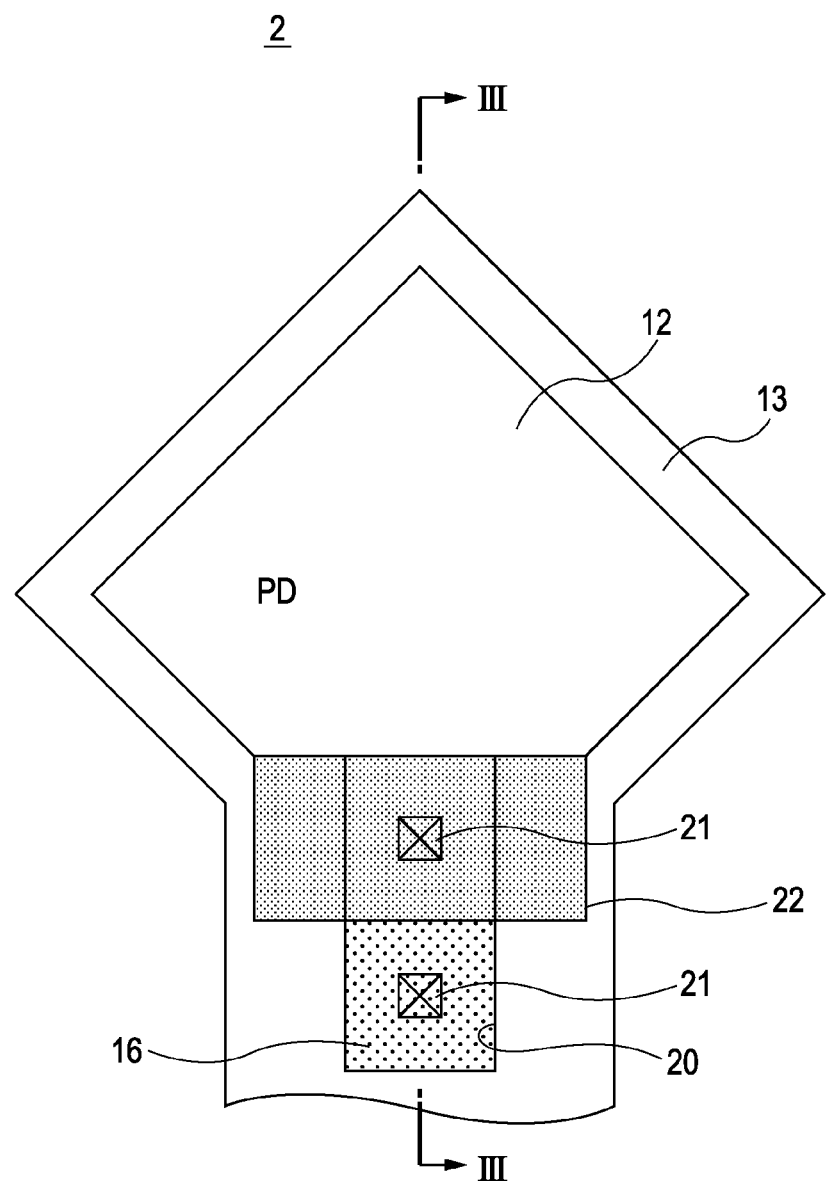
FIG. 2 is a plan view of a configuration for one pixel of the solid-state imaging device according to the first embodiment of the present invention.
Figure 3:
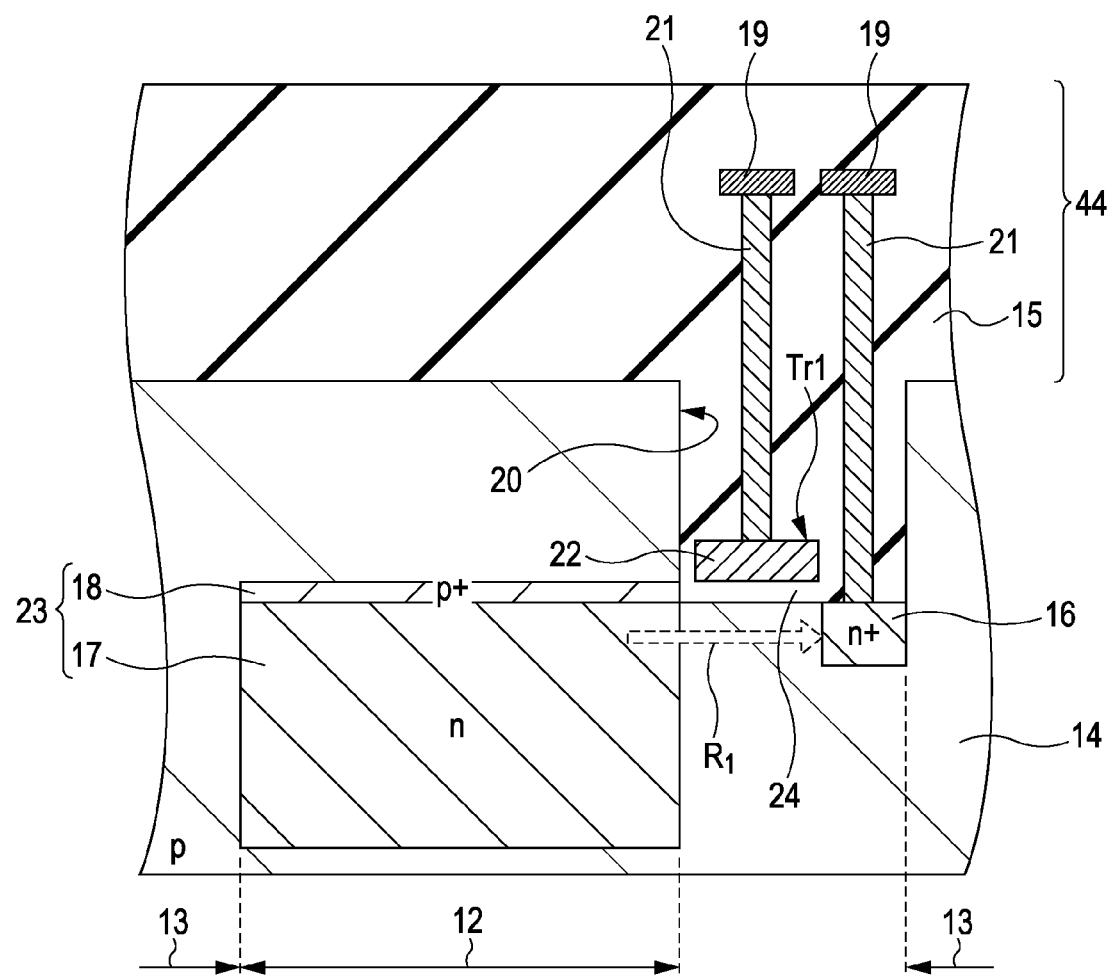
FIG. 3 is a sectional view of a configuration taken along line III-III in FIG. 2.

FIG. 2 is a plan view of a configuration for one pixel of the solid-state imaging device according to the first embodiment of the present invention, and FIG. 3 is a sectional view of a configuration taken along line III-III in FIG. 2.

As shown in FIGS. 2 and 3, each of the pixels 2 of the solid-state imaging device according to the first embodiment includes a buried photodiode (hereinafter referred to as "PD") 23 and a buried floating diffusion (hereinafter referred to as "FD") 16 which are formed in a semiconductor substrate 14. Further, each of the pixels 2 includes a buried gate electrode 22 provided on the semiconductor substrate 14. In addition, a wiring layer 44 is formed on the surface side of the semiconductor substrate 14 in which the pixels 2 are formed.

The semiconductor substrate 14 is a silicon substrate of first conductivity type (hereinafter, p type).

The wiring layer 44 includes wiring 19 composed of aluminum (Al) or copper (Cu) and formed on the surface side of the semiconductor substrate 14 through an interlayer insulating film 15. FIG. 3 shows only one layer of the wiring 19 formed in the wiring layer 44, but a laminated structure of a plurality of layers is actually used.

The buried PD 23 includes a p-type high-concentration impurity region 18 formed at a predetermined depth in the semiconductor substrate 14 and an impurity region 17 of second conductivity type (hereinafter, n type) formed below the p-type high-concentration impurity region 18. Namely, the buried PD 23 is mainly composed of a pn junction between the p-type high-concentration impurity region 18 the n-type impurity region 17. In this embodiment, the pn junction constituting the buried PD 23 is formed at a depth of about 1 μm from the surface of the semiconductor substrate 14. In a plan view of FIG. 2, a region in which the buried PD 23 is formed is shown as a "photodiode region 12" when the pixel 2 is viewed in plan.

The buried FD 16 includes an n-type high-concentration impurity region formed at a depth equal to that of the buried PD 23 in the semiconductor substrate 14 so as to correspond to a bottom of a trench portion 20 formed in the semiconductor substrate 14. Namely, the trench portion 20 is formed to a depth of about 1 μm from the surface of the semiconductor substrate 14. The buried FD 16 is connected, through a contact portion 21 composed of tungsten (W), to the desired wiring 19 which is formed on the surface side of the semiconductor substrate 14 through the interlayer insulating film 15.

The buried gate electrode 22 is composed of, for example, polysilicon, and is formed, through a gate insulating film 24, on the semiconductor substrate 14 including the bottom of the trench portion 20 formed in the semiconductor substrate 14. The buried gate electrode 22 is connected, through a contact portion 21, to the desired wiring 19 which is formed on the surface side of the semiconductor substrate 14. The buried gate electrode 22 is formed on the semiconductor substrate 14 to be disposed between the buried FD 16 and the buried PD 23, and constitutes a transfer transistor Tr1 for transferring signal charge produced in the buried PD 23 to the buried FD 16. In this embodiment, the transfer transistor Tr1 is an n-channel MOS transistor. In this embodiment, as shown in the plan view of FIG. 2, the buried gate electrode 22 is formed to project outward from the trench portion 20 to above the semiconductor substrate 14 within a range in which the buried gate electrode 22 does not overlap the buried FD 16. Since the buried gate electrode 22 may be formed to project outward from the trench portion 20, mask alignment is easily made during formation of the gate electrode. In addition, the buried gate electrode 22 may be increased in size, thereby facilitating the formation of the contact portions 21.

In the semiconductor substrate 14, each of the pixels 12 including the buried PD 23, the buried FD 16, and the buried gate electrode 22 is formed within a region partitioned by an element separation region 13 as shown in FIG. 2. The element separation region 13 is formed in, for example, a p-type high-concentration impurity region, but not shown in a sectional view of FIG. 3. Although pixel transistors, such as a rest transistor, an amplifying transistor, and the like, other than the transfer transistor Tr1 are actually formed, these transistors are not shown in the drawings.

The solid-state imaging device 1 of this embodiment may be a front-side illumination-type solid-state imaging device in which light is illuminated from the front side of the semiconductor substrate 14 or a back-side illumination-type solid-state imaging device in which light is illuminated from the back side of the semiconductor substrate 14. In the front-side illumination-type solid-state imaging device, a color filter layer for transmitting desired light and an on-chip lens for efficiently collecting incident light in the buried PD 23 are formed in order on the wiring layer 44 formed on the semiconductor substrate. In the back-side illumination-type solid-state imaging device, a color filter layer and an on-chip lens are formed in order on the back side of the semiconductor substrate 14 opposite to the side on which the wiring layer 44 is formed.

In the solid-state imaging device 1 of this embodiment, the buried PD 23 formed in the semiconductor substrate 14 generates signal charge by photoelectric conversion and stores it according to the quantity of incident light. When a desired transfer voltage is applied to the buried gate electrode 22 through the wiring 19 and the contact portions 21 formed in the wiring layer 44, the signal charge stored in the buried PD 23 is transferred to the buried FD 16 through a transfer path as shown by arrow $R_1$.

Figure 28:
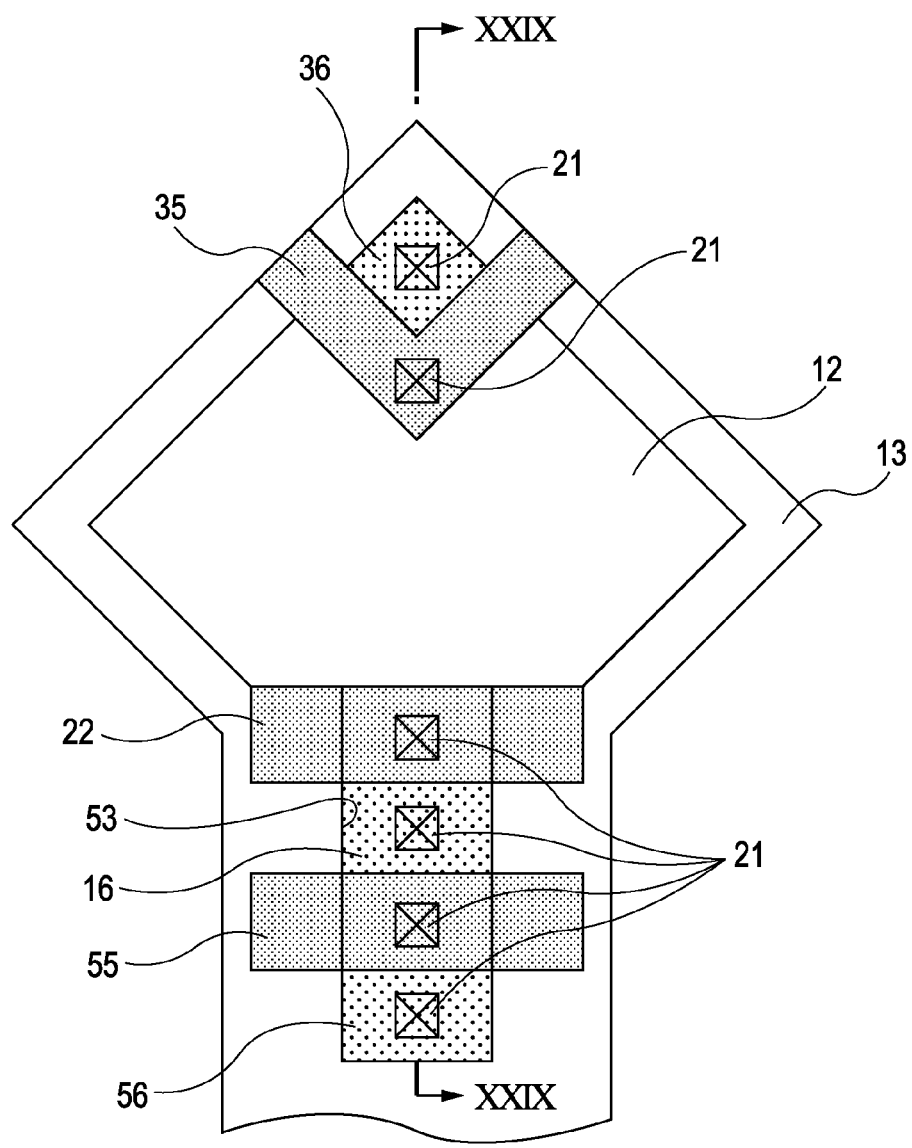
FIG. 28 is a schematic plan view of a configuration of a principal portion of a solid-state imaging device according to a tenth embodiment of the present invention.
Figure 29:
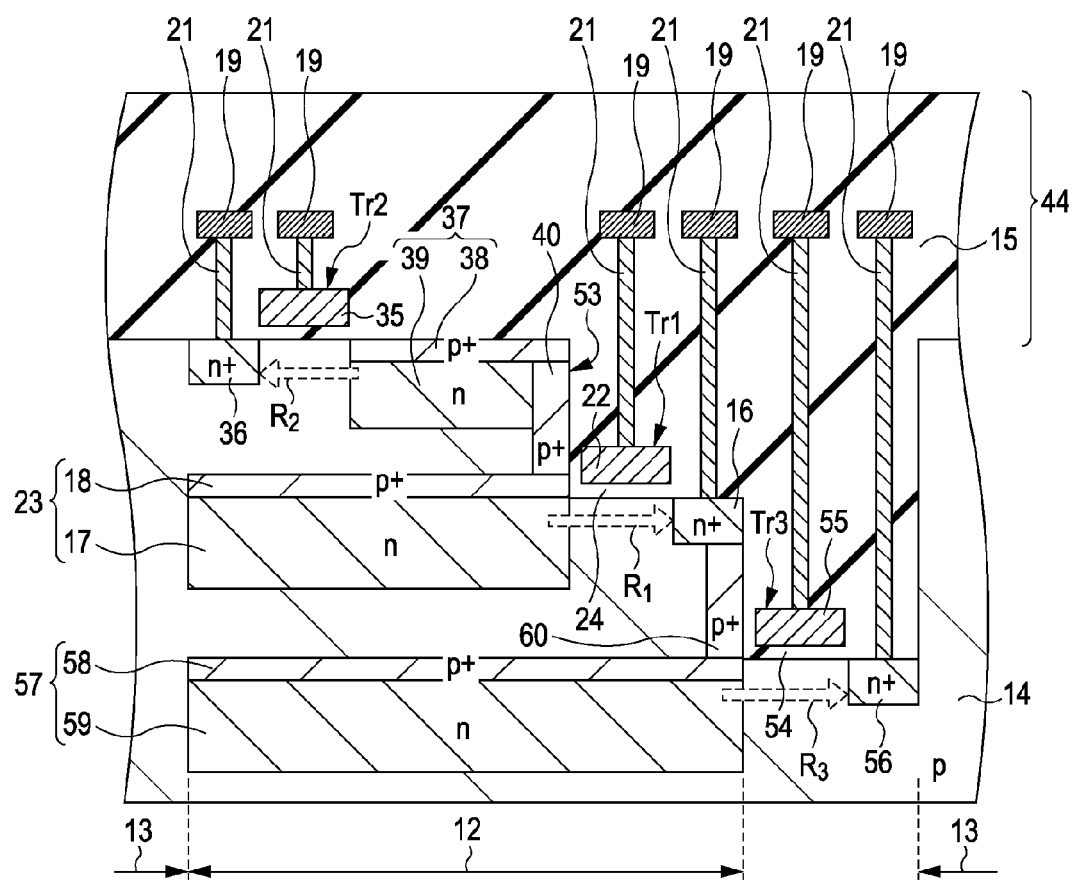
FIG. 29 is a sectional view of a configuration taken along line XXIX-XXIX in FIG. 28.

In the solid-state imaging device 1 of this embodiment, the signal charge generated and stored in the buried PD 23 is transferred to the buried FD 16 formed at a depth equal to that of the buried PD 23 as shown by arrow $R_1$, thereby permitting good charge transfer. In a usual solid-state imaging device, as shown in FIGS. 28 and 29, when a photodiode is formed inside a semiconductor substrate, there occurs the problem of making a transfer path longer because signal charge is read out to the surface of a substrate, thereby causing transfer residue of the signal charge. However, in the solid-state imaging device 1 of this embodiment, the problem of transfer residue is resolved because the transfer path is shortened.

Also, in the solid-state imaging device 1 of this embodiment, the buried PD 23 permits the extension of the photodiode region 12 in the semiconductor substrate 14 without limitation by a structure formed on the surface of the semiconductor substrate 14.

Figure 4:
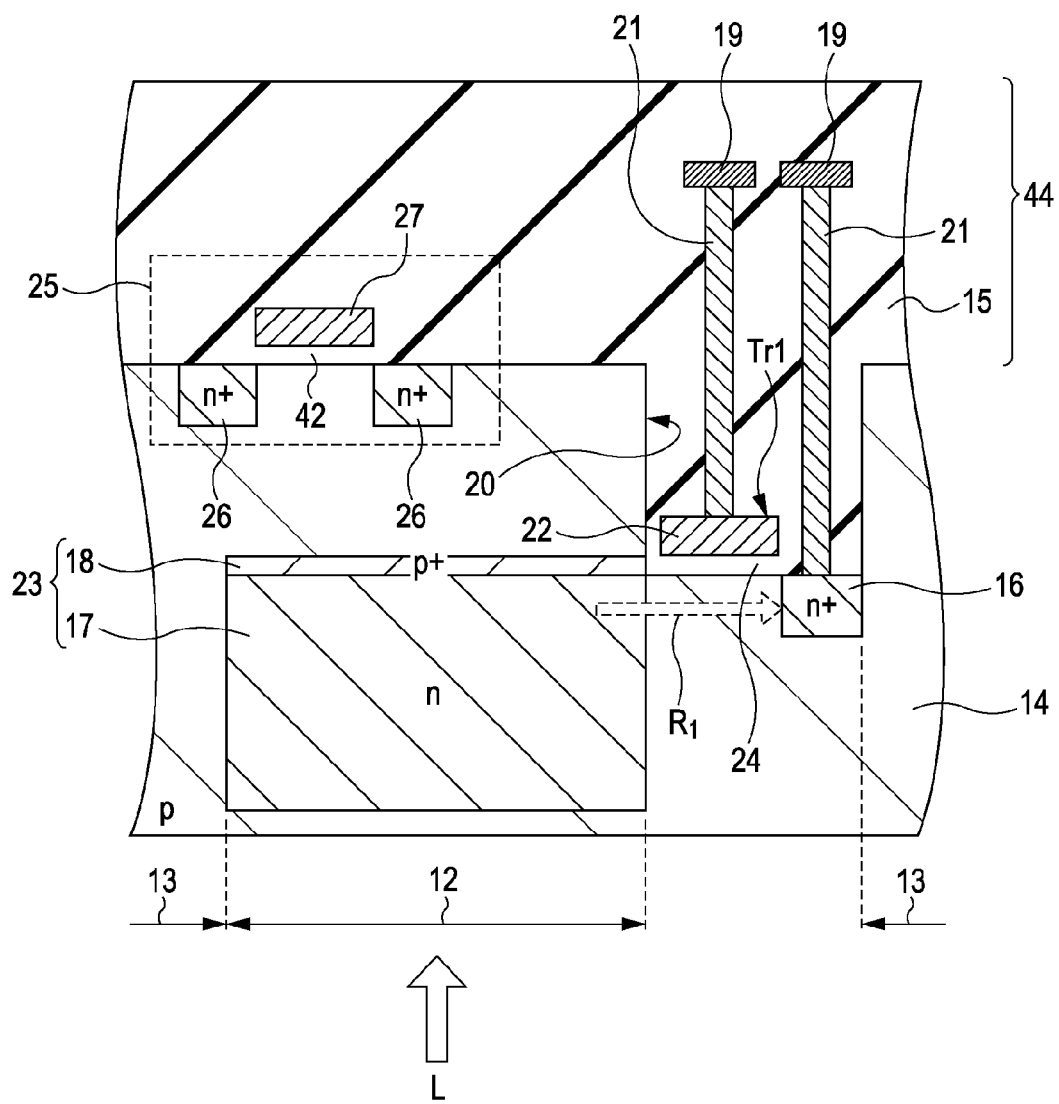
FIG. 4 is a schematic sectional view of a configuration of a principal portion of the solid-state imaging device according to the first embodiment of the present invention in the case where pixel transistors (for example, a reset transistor, an amplifying transistor, and the like) other than a transfer transistor are formed on the surface side of a semiconductor substrate.

FIG. 4 is a schematic sectional view of a configuration in which a pixel transistor 25 (for example, a reset transistor, an amplifying transistor, or the like) other than the transfer transistor Tr1 is formed on the surface side of the semiconductor substrate 14. As shown in FIG. 4, the pixel transistor 25 includes source/drain regions 26 formed on the surface side of the semiconductor substrate 14 and a gate electrode 27 formed on the surface of the semiconductor substrate 14 through a gate insulating film 42. In this case, as shown in FIG. 4, even when the pixel transistor 25 is formed in the photodiode region 12 of the semiconductor substrate 14, the buried PD 23 may be formed in a wide area, and thus a quantity (Qs) of saturation electric charge is not decreased. In addition, even in the back-side illumination-type solid-state imaging device in which light is illuminated from the back side of the semiconductor substrate 14 as shown in FIG. 4, a high quantity (Qs) of saturation electric charge may be maintained.

Therefore, the solid-state imaging device 1 of this embodiment is capable of efficiently transferring signal charge to the buried FD 16 without decreasing the transfer efficiency even when the buried Pd 23 having a high quantity (Qs) of saturation electric charge is formed inside the semiconductor substrate 14. That is, both an increase in the quantity (Qs) of saturation electric charge and complete transfer of signal charge may be realized.

2. Second Embodiment

Next, a solid-state imaging device according to a second embodiment of the present invention is described.

Figure 5:
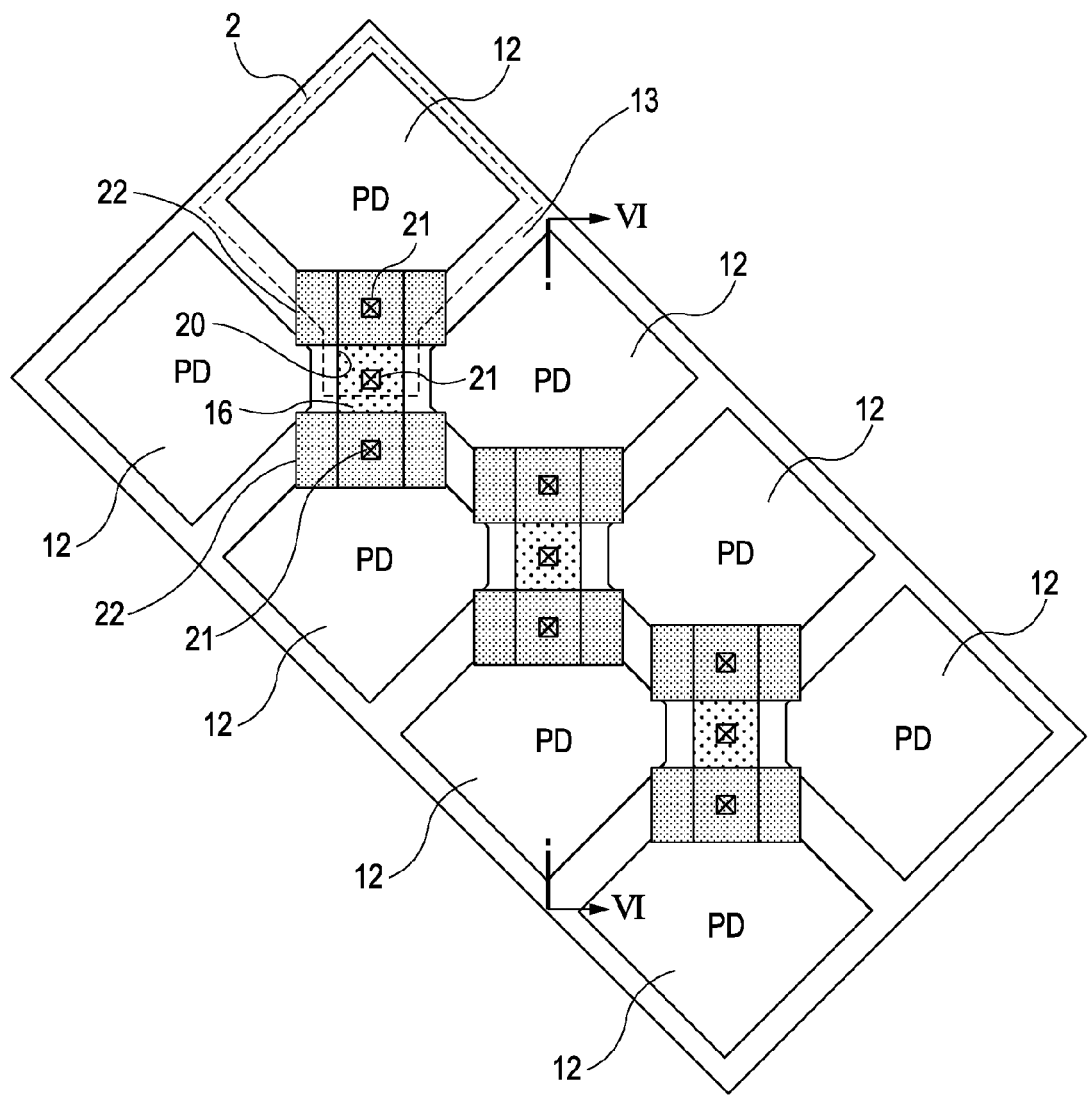
FIG. 5 is a plan view of a configuration of a principal portion of a solid-state imaging device according to a second embodiment of the present invention.
Figure 6:
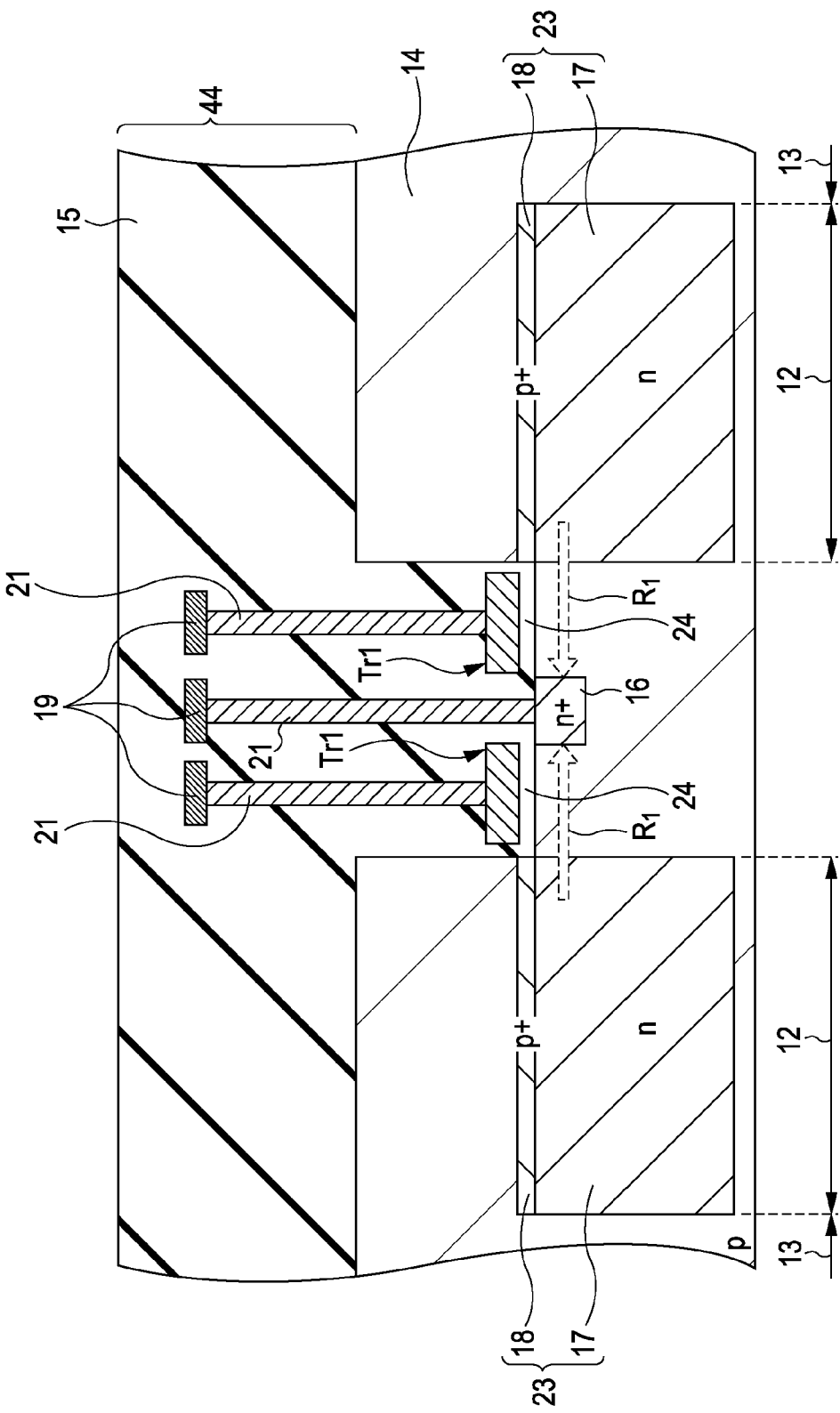
FIG. 6 is a sectional view of a configuration taken along line VI-VI in FIG. 5.

FIG. 5 is a schematic plan view of a configuration a principal portion of the solid-state imaging device according to the second embodiment of the present invention, and FIG. 6 is a schematic sectional view of a configuration taken along line VI-VI in FIG. 5. Since the overall configuration of the solid-state imaging device according to the second embodiment is the same as in FIG. 1, duplicate description is omitted. In FIGS. 5 and 6, portions corresponding to FIGS. 2 and 3 are denoted by the same reference numerals, and duplicate description is omitted.

As shown in FIG. 5, one buried FD 16 common to the adjacent two pixels 2 is formed. In this case, as shown in FIG. 6, the trench portion 20 is formed in a region between the adjacent two photodiode regions 12, and the buried FD 16 is formed in the semiconductor substrate 14 so as to correspond to the bottom of the trench portion 20. In addition, the buried gate electrodes 22 constituting the transfer transistors Tr1 of the respective pixels 2 are formed at the inner bottom of the trench portion 20 between the buried FD 16 and the buried PDs 23 adjacent thereto.

In this configuration, in the two pixels 2 having one common buried FD 16, signal charges stored in the buried PDs 23 are successively read out to the common buried FD 16.

The solid-state imaging device according to the second embodiment may include one buried FD common to two pixels 2, and thus one trench portion 20 may be formed for two pixels 2, thereby decreasing an area for forming the transfer transistor Tr1. In addition, in this embodiment, the trench portion 20 is formed over two pixels 2, and thus the trench portion 20 may be formed in a larger size as compared with the case in which one trench portion 20 is formed for one buried PD 23, thereby facilitating manufacture.

3. Third Embodiment

Figure 7:
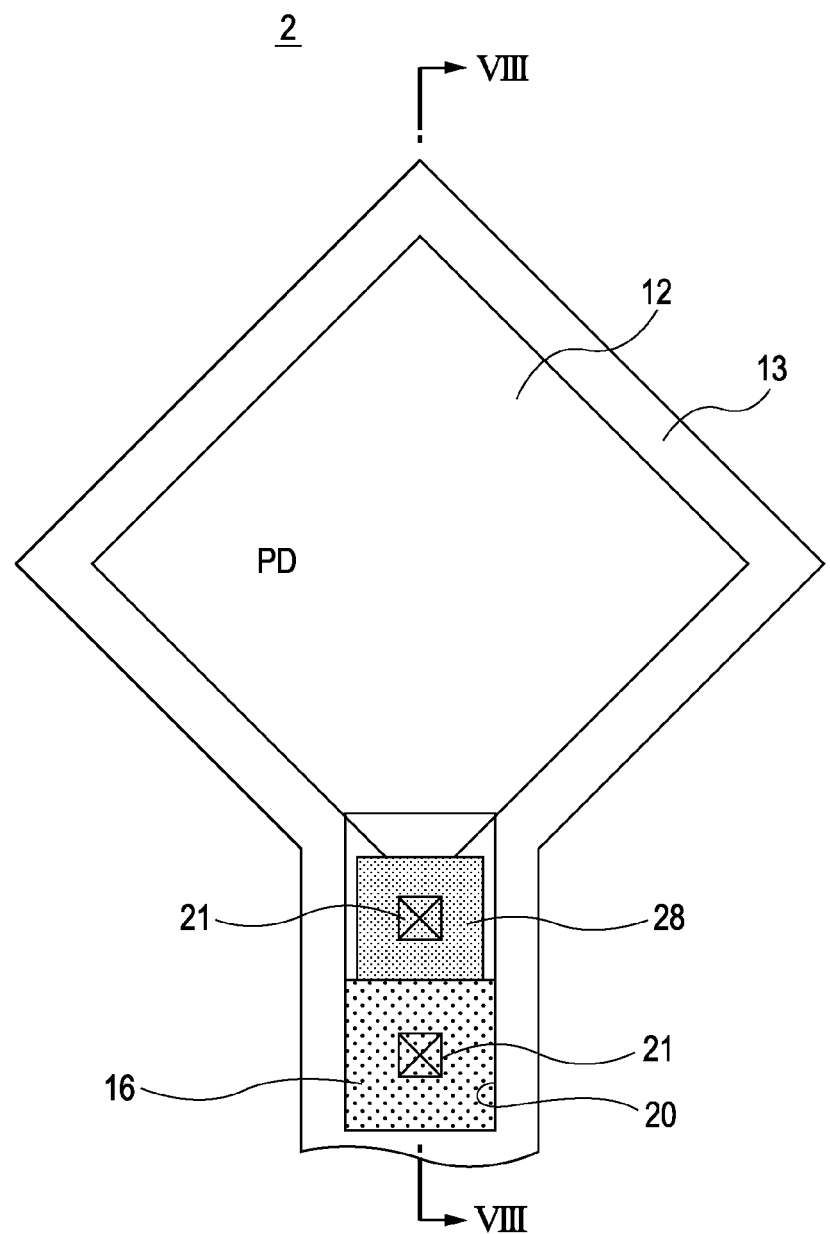
FIG. 7 is a plan view of a configuration of a principal portion of a solid-state imaging device according to a third embodiment of the present invention.
Figure 8:
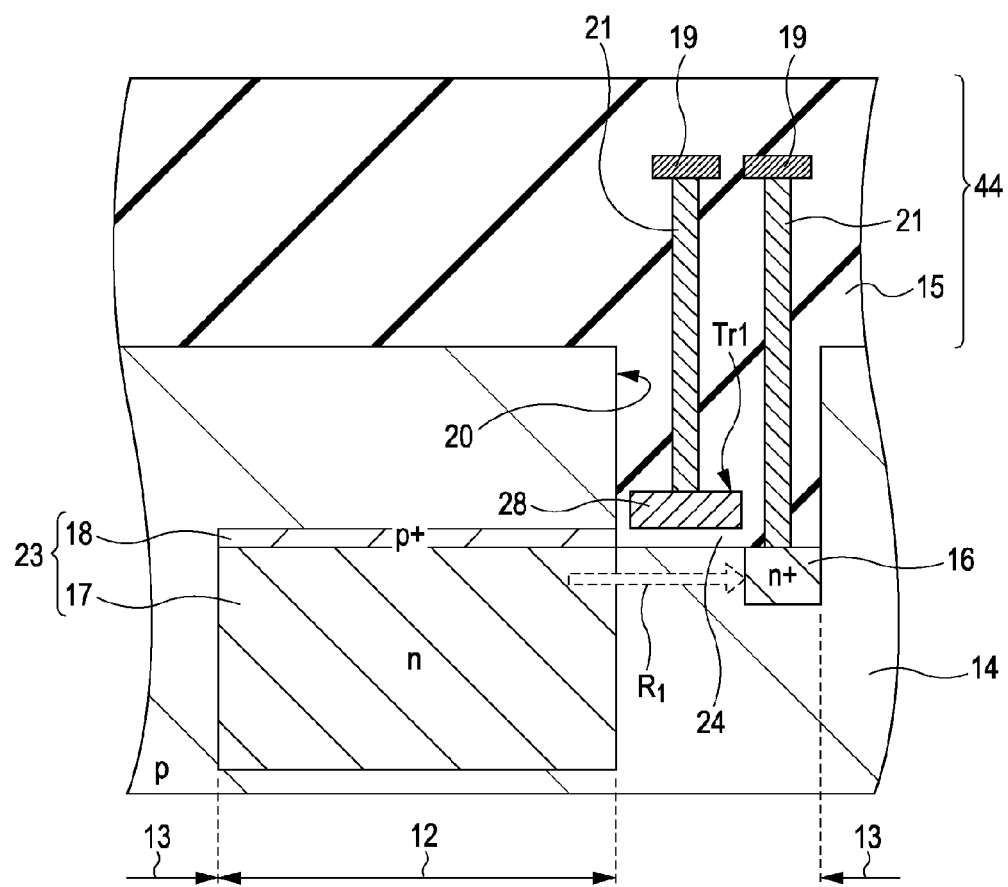
FIG. 8 is a sectional view of a configuration taken along line VIII-VIII in FIG. 7.

Next, a solid-state imaging device according to a third embodiment of the present invention is described.
3-1 Configuration of Principal Portion FIG. 7 is a schematic plan view of a configuration a principal portion of the solid-state imaging device according to the third embodiment of the present invention, and FIG. 8 is a schematic sectional view of a configuration taken along line VIII-VIII in FIG. 7. Since the overall configuration of the solid-state imaging device according to the third embodiment is the same as in FIG. 1, duplicate description is omitted. In FIGS. 7 and 8, portions corresponding to FIGS. 2 and 3 are denoted by the same reference numerals, and duplicate description is omitted.

Unlike in the solid-state imaging device according to the thirst embodiment, in the solid-state imaging device according to the third embodiment, as shown in FIG. 7, a buried gate electrode 28 constituting a transfer transistor Tr1 is formed only within the trench portion 20.

That is, the buried gate electrode 28 is formed only at the bottom of the trench portion 20 above a transfer path of signal charge from the buried PD 23 to the buried FD 16, but not formed on the sidewall of the trench portion 20 and on the surface of the semiconductor substrate outside the trench portion 20.

Like in the first embodiment, in the solid-state imaging device of this embodiment having the above-described configuration, signal charge is transferred from the buried PD 23 to the buried FD 16 formed at a depth equal to that of the buried PD 23. In this embodiment, transfer residue of the signal charge stored in the buried PD 23 may be decreased because of the short transfer path.

In addition, in the solid-state imaging device of this embodiment, the buried gate electrode 28 is formed only at the bottom of the trench portion 20, and thus when a transfer voltage to the buried gate electrode 28, the voltage is not applied to portions other than the transfer path of the signal charge in the semiconductor substrate 14. Therefore, the signal charge stored in the buried PD 23 may be efficiently transferred to the buried FD 16.
3-2 Manufacturing Method (1)

FIGS. 9A to 12J show steps of a method (1) for manufacturing the solid-state imaging device of this embodiment.

Figure 9A:
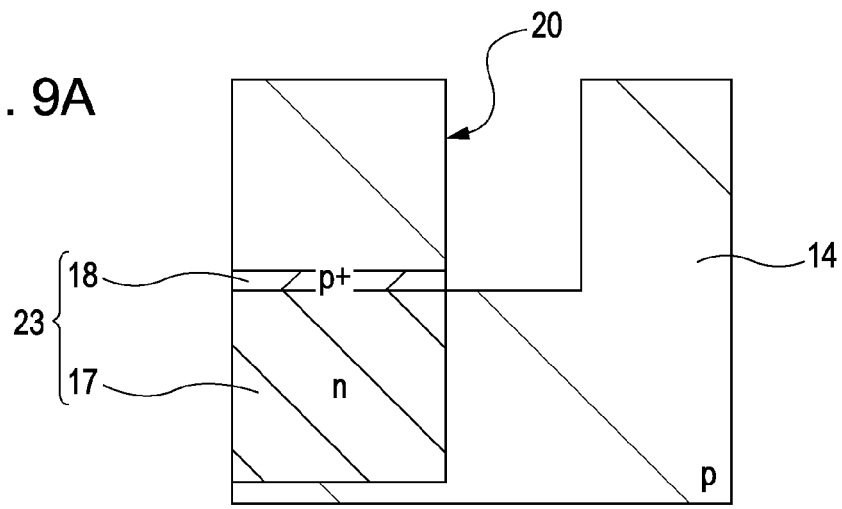
FIGS. 9A, 9B, and 9C are drawings of steps of a method for manufacturing the solid-state imaging device according to the third embodiment of the present invention.

First, the semiconductor substrate 14 is prepared, and as shown in FIG. 9A, p-type impurity and n-type impurity ions are implanted to desired depths of the semiconductor substrate 14 to form the p-type high-concentration impurity region 18 and the n-type impurity region 17, forming the buried PD 23. The buried PD 23 is formed in a plural number in desired regions of the semiconductor substrate 14. Then, a region adjacent to the buried PD 23 is removed by etching from the surface of the semiconductor substrate 14 to form the trench portion 20 with a depth reaching the buried Pd 23.

Figure 9B:
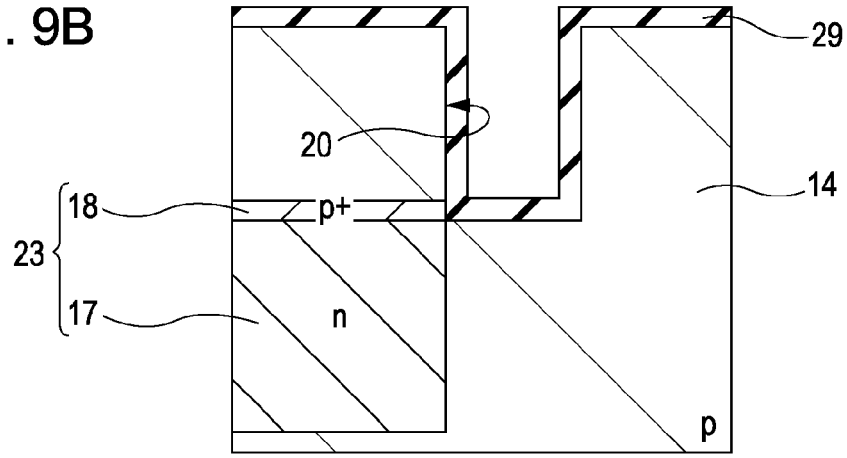

Then, as shown in FIG. 9B, an oxide film 29 composed of a silicon oxide film is deposited on the surface of the semiconductor substrate 14 including the bottom and the side wall of the trench portion 20.

Figure 9C:
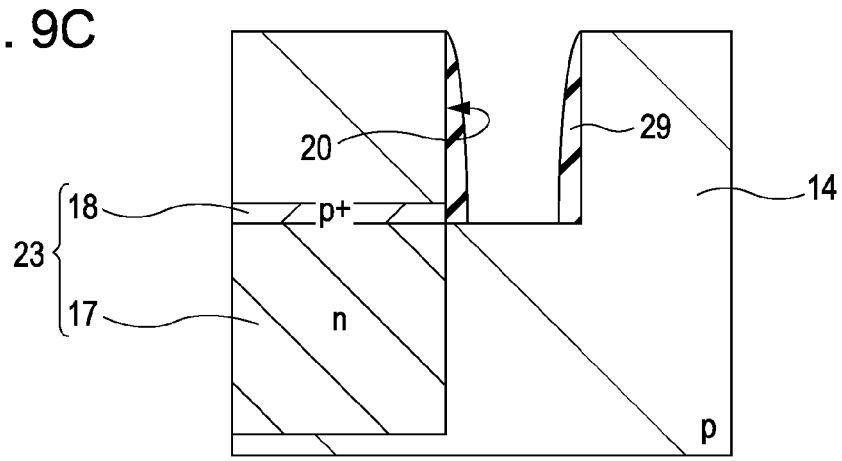

Then, as shown in FIG. 9C, the oxide film 29 is left only on the side wall of the trench portion 20 by overall etching-back.

Figure 10D:
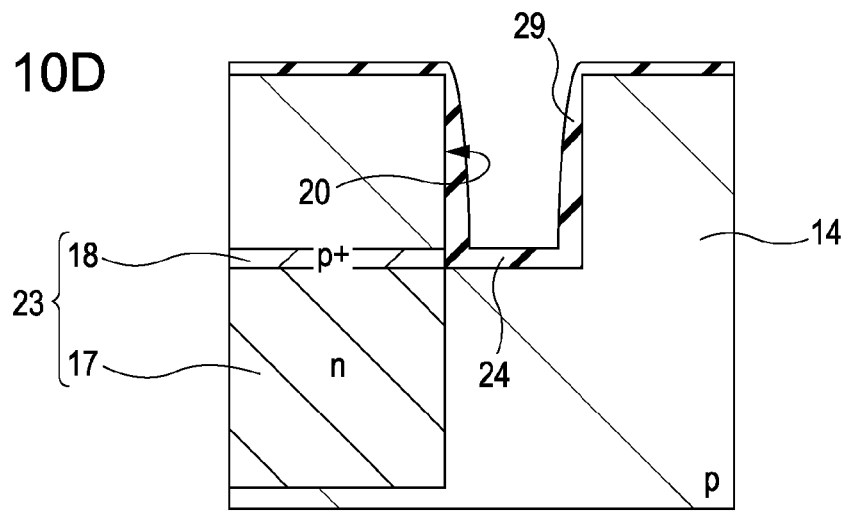
FIGS. 10D, 10E, and 10F are drawings of steps of the method for manufacturing the solid-state imaging device according to the third embodiment of the present invention.

Then, as shown in FIG. 10D, the gate insulating film 24 composed of a silicon oxide film is deposited over the entire surface of the semiconductor substrate 14 including the bottom of the trench portion 20.

Figure 10E:
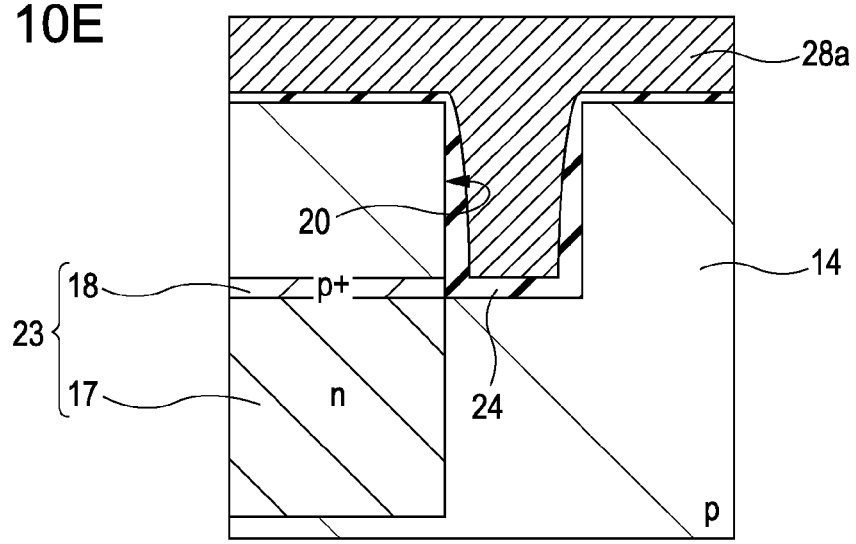

Then, as shown in FIG. 10E, a polysilicon layer 28a is deposited over the entire surface of the semiconductor substrate 14 so as to fill the trench portion 20. In this case, in order to improve the flatness of the upper surface of the polysilicon layer 28a, CMP (Chemical Mechanical Polishing) may be performed.

Figure 10F:
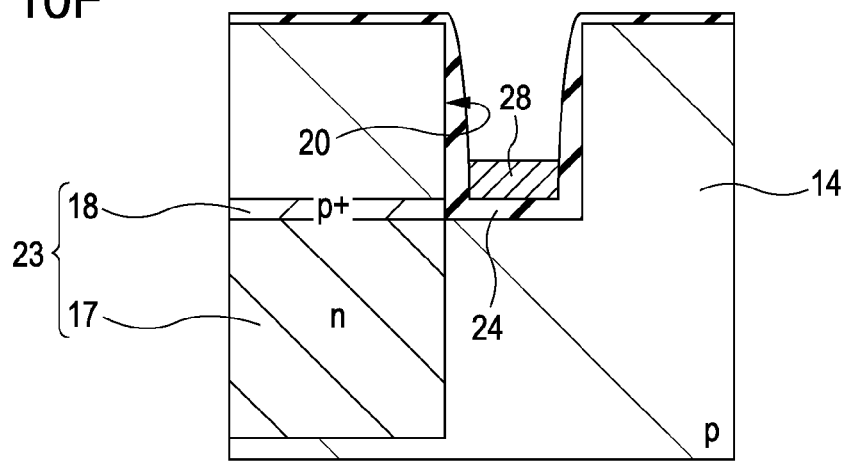

Then, as shown in FIG. 10F, the buried gate electrode 28 composed of the polysilicon layer 28a is formed only at the bottom of the trench portion 20 by etching-back the polysilicon layer 28a.

Figure 11G:
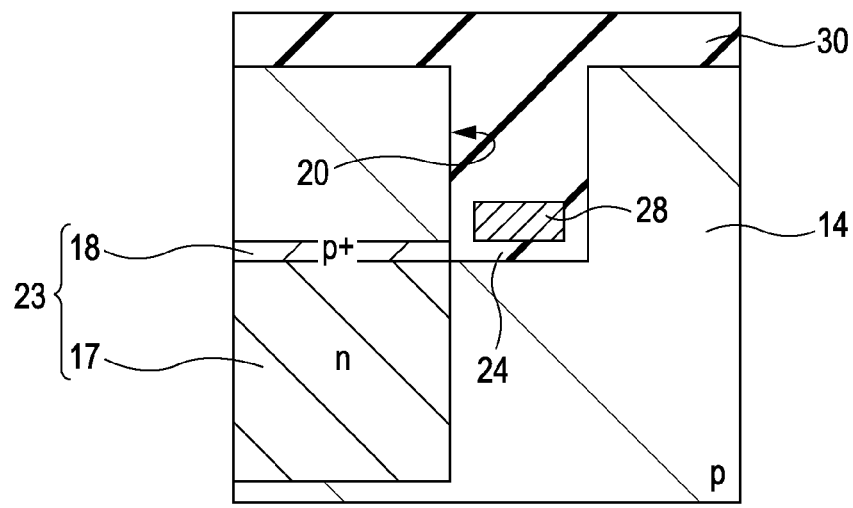
FIGS. 11G and 11H are drawings of steps of the method for manufacturing the solid-state imaging device according to the third embodiment of the present invention.

Then, as shown in FIG. 11G, an oxide film 30 composed of a silicon oxide film is formed over the entire surface of the semiconductor substrate 14 so as to coat the buried gate electrode 28 formed at the bottom of the trench portion 20. Then, the upper surface of the oxide film 30 is planarized by CMP.

Figure 11H:
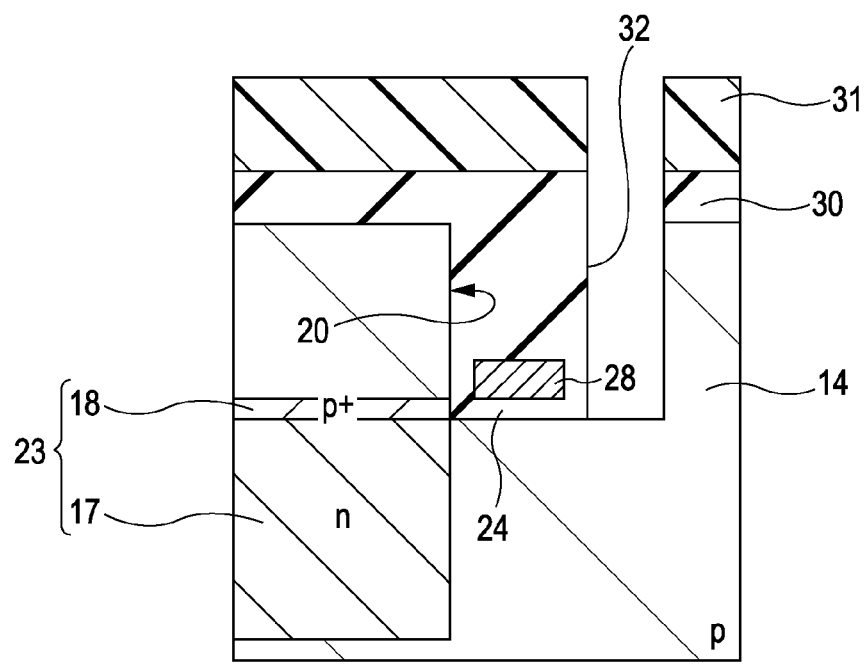

Next, as shown in FIG. 11H, a resist 31 having an opening formed in a desired region is formed on the oxide film 30, and the oxide film 30 and the semiconductor substrate 14 below the resist 31 are removed by etching using the resist 31 as a mask to further form a trench portion 32. The trench portion 32 is formed to a depth equal to that of the trench portion 20 so as to further widen the trench portion 20.

Figure 12I:
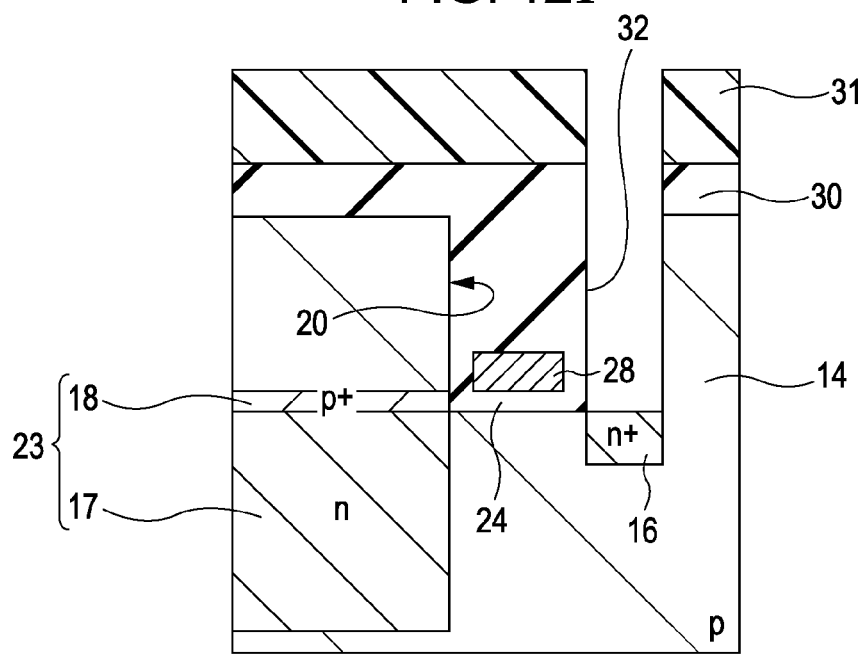
FIGS. 12I and 12J are drawings of steps of the method for manufacturing the solid-state imaging device according to the third embodiment of the present invention.

Next, as shown in FIG. 12I, n-type impurity ions are implanted into a region of the semiconductor substrate 14, which faces the bottom of the trench portion 32, using the resist 31 and the oxide film 30 as a mask to form the buried FD 16.

Consequently, the buried FD 16 is formed at a depth equal to that of the buried PD 23.

Figure 12J:
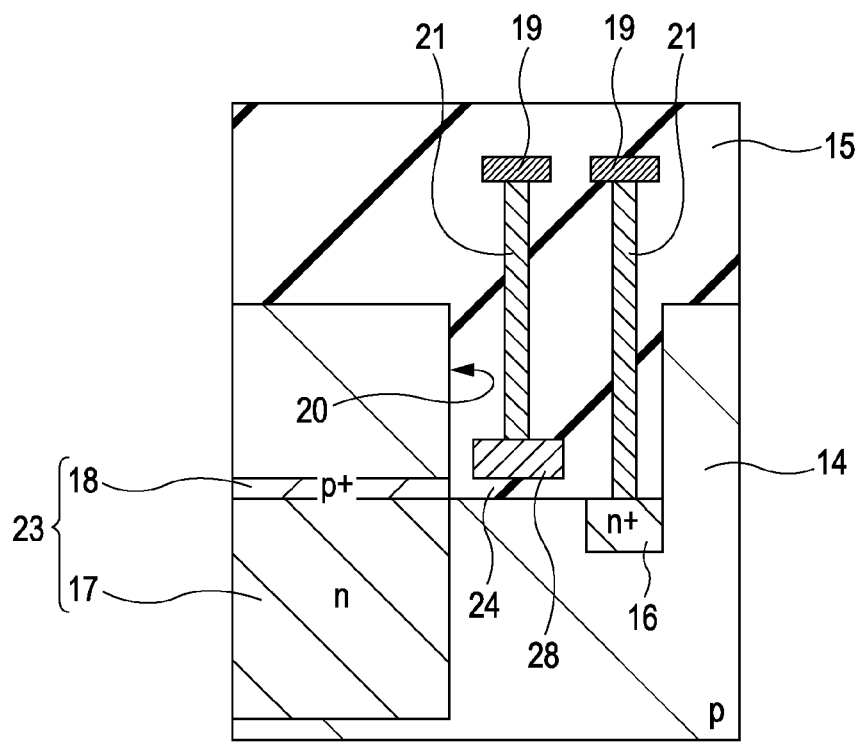

Next, as shown in FIG. 12J, the interlayer insulating film 15, the contact portions 21, and the wiring 19 are formed on the surface of the semiconductor substrate 14 by usual methods, thereby completing the solid-state imaging device shown in FIGS. 7 and 8.

Although, in the manufacturing method (1) of this embodiment, the buried PD 23 is formed before the trench portion 20 is formed, the buried PD 23 may be formed after the trench portion 20 is formed.

The method for the manufacturing the solid-state imaging device of this embodiment is not limited to this. Next, a method (2) for the manufacturing the solid-state imaging device of this embodiment is described.
3-3 Manufacturing Method (2)

FIGS. 13A to 14F show steps of a method (2) for manufacturing the solid-state imaging device of this embodiment.

Figure 13A:
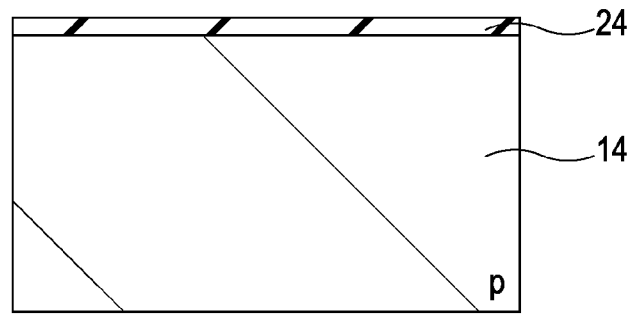
FIGS. 13A, 13B, and 13C are drawings of steps of another method for manufacturing the solid-state imaging device according to the third embodiment of the present invention.

First, as shown in FIG. 13A, a gate insulating film 24 composed of a silicon oxide film is formed on the semiconductor substrate 14.

Figure 13B:
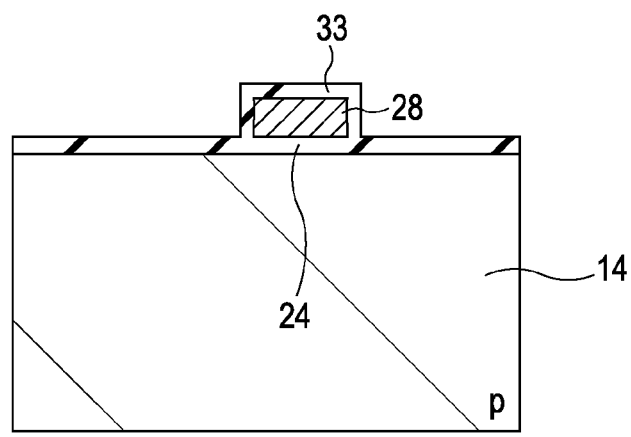

Next, as shown in FIG. 13B, the buried gate electrode 28 composed of polysilicon is formed on a desired region of the gate insulating film 24. Then, an oxide film 33 composed of a silicon oxide film is further formed to coat the buried gate electrode 28.

Figure 13C:
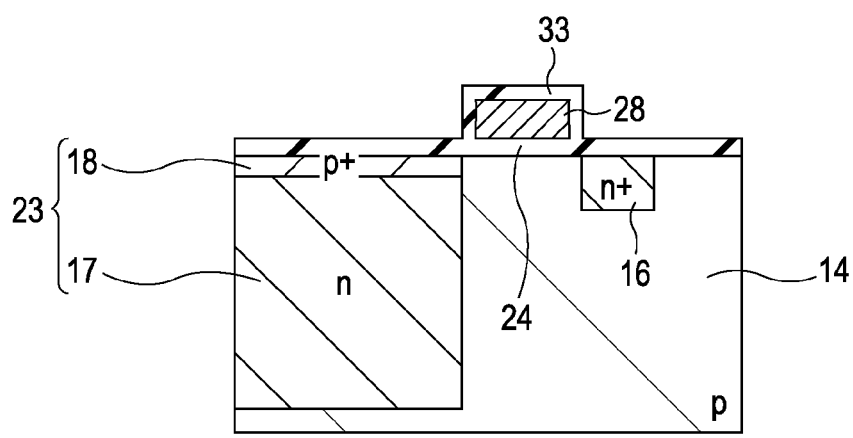

Next, as shown in FIG. 13C, the p-type high-concentration impurity region 18 and the n-type impurity region 17 are formed by ion implantation in a desired region of the semiconductor substrate 14 on one of the sides adjacent to the buried gate electrode 28, forming the buried PD 23. In addition, an n-type high-concentration impurity region is formed by ion implantation in a desired region of the semiconductor substrate 14 on the other side adjacent to the buried gate electrode 28, forming the buried FD 16. In this case, the buried PD 23 and the buried FD 16 are formed in self-alignment on the sides of the buried gate electrode 28 using the buried gate electrode 28 as a mask.

Figure 14D:
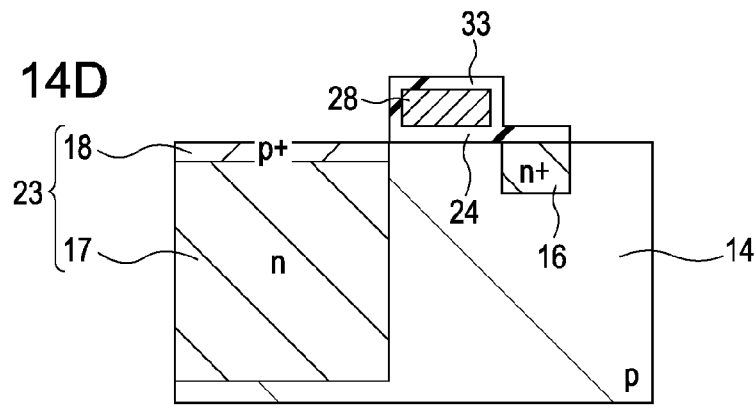
FIGS. 14D, 14E, and 14F are drawings of steps of the other method for manufacturing the solid-state imaging device according to the third embodiment of the present invention.

Next, as shown in FIG. 14D, the oxide film 33 is removed by etching to exposure the semiconductor substrate 14, leaving the oxide film 33 only on the buried gate electrode 28 and the buried FD 16.

Figure 14E:
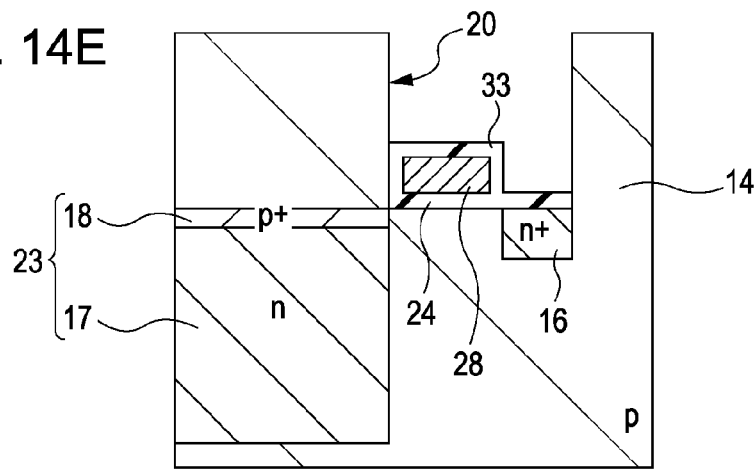

Next, as shown in FIG. 14E, the trench portion 20 is formed by selective epitaxial growth of the semiconductor substrate 14 excluding a region where the buried gate electrode 28 and the buried FD 16 are formed.

Figure 14F:
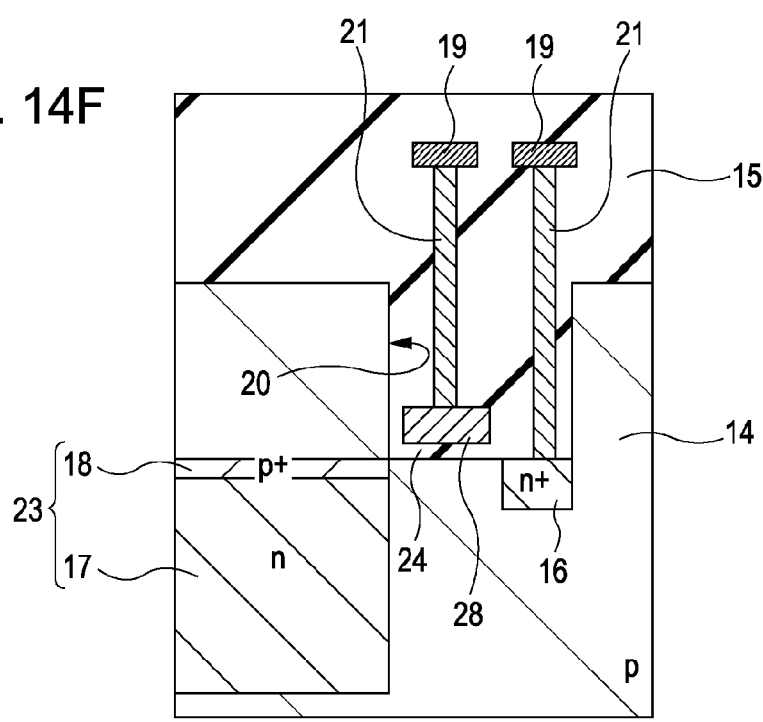

Next, as shown in FIG. 14F, the interlayer insulating film 15, the contact portions 21, and the wiring 19 are formed on the surface of the semiconductor substrate 14 by usual methods, thereby completing the solid-state imaging device shown in FIGS. 7 and 8.

Although, in the manufacturing method (2) of this embodiment, the buried PD 23 is formed before the buried gate electrode 28 is formed, the buried PD 23 may be formed after the trench portion 20 is formed.

The above-described manufacturing methods (1) and (2) are capable for forming the buried gate electrode 28 only at the bottom of the trench portion 20.

4. Fourth Embodiment

Solid-State Imaging Device

Next, a solid-state imaging device according to a fourth embodiment of the present invention is described.

Figure 15:
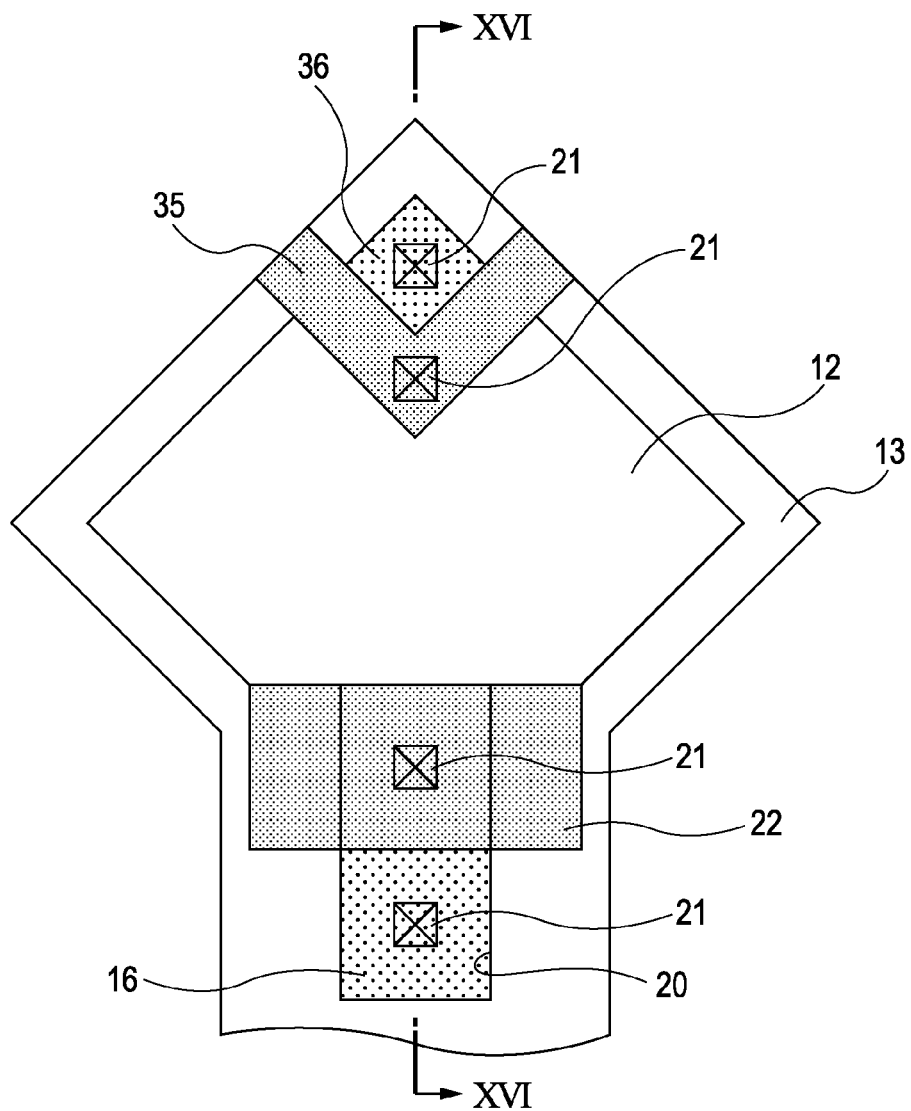
FIG. 15 is a plan view of a configuration of a principal portion of a solid-state imaging device according to a fourth embodiment of the present invention.
Figure 16:
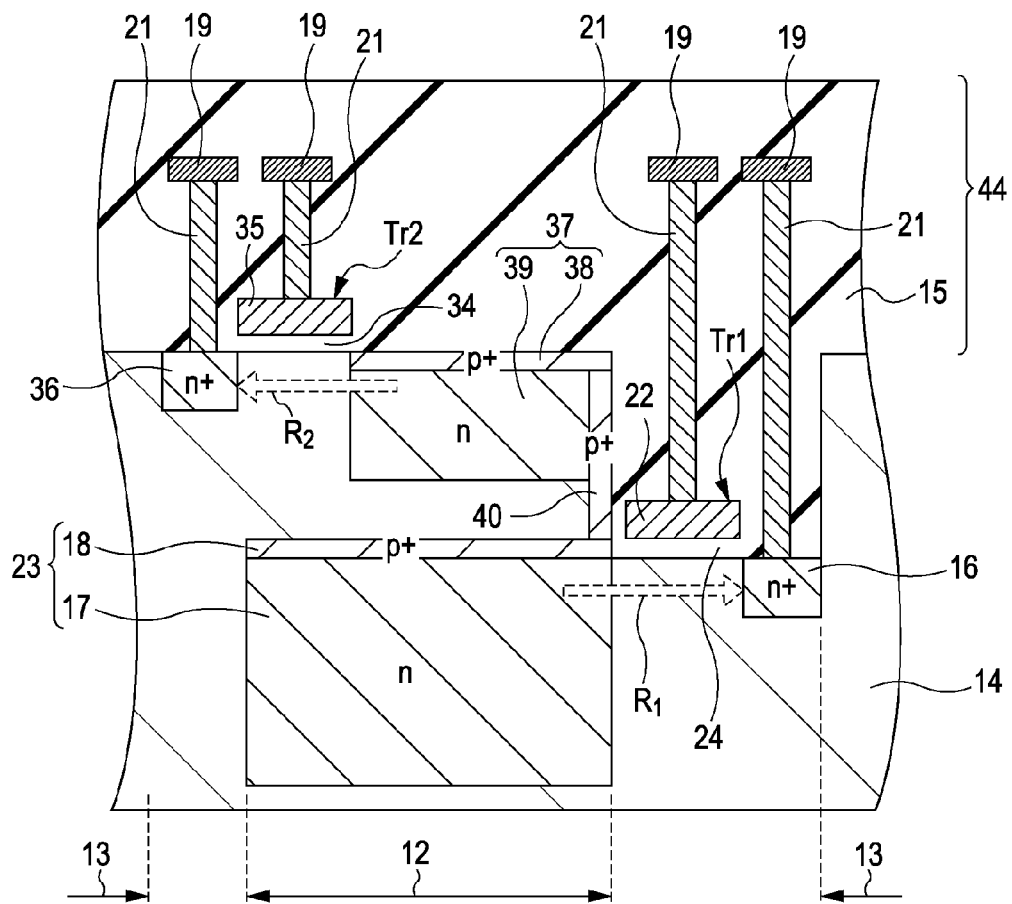
FIG. 16 is a sectional view of a configuration taken along line XVI-XVI in FIG. 15.

FIG. 15 is a schematic plan view of a configuration of a principal portion of the solid-state imaging device according to the fourth embodiment of the present invention, and FIG. 16 is a schematic sectional view of a configuration taken along line XVI-XVI in FIG. 15. Since the overall configuration of the solid-state imaging device according to the fourth embodiment is the same as in FIG. 1, duplicate description is omitted. In FIGS. 15 and 16, portions corresponding to FIGS. 2 and 3 are denoted by the same reference numerals, and duplicate description is omitted.

In the solid-state imaging device according to the fourth embodiment, each of the pixels 2 in the solid-state imaging device 1 according to the first embodiment further includes a wiring layer-side photodiode (hereinafter referred to as "PD") and a wiring layer-side floating diffusion (hereinafter referred to as "FD"). In a plan view of FIG. 15, a region in which the buried PD 23 and a wiring layer-side PD 37 are formed is shown as a "photodiode region 12" when the pixel 2 is viewed in plan.

The wiring layer-side PD 37 includes a p-type high-concentration impurity region 38 formed on the surface side of the semiconductor substrate 14 and an n-type impurity region 39 formed below the p-type high-concentration impurity region 38. Namely, the wiring layer-side PD 37 is mainly composed of a pn junction between the p-type high-concentration impurity region 38 the n-type impurity region 39. In addition, the wiring layer-side PD 37 is formed above the buried PD 23. That is, each of the pixels 2 in this embodiment includes two photodiode layers including the wiring layer-side PD 37 and the buried PD 23 in the depth direction of the semiconductor substrate 14.

In addition, a photodiode separation region 40 including a p-type high-concentration impurity region is formed in a region between the buried PD 23 and the wiring layer-side PD 37, the region being in contact with the side surface of the trench portion 20. The photodiode separation region 40 is formed for preventing signal charge from flowing between the buried PD 23 and the wiring layer-side PD 37. Although not shown in FIG. 16, the photodiode separation region 40 may be formed in a region other than the region shown in FIG. 16 in order to separate between the buried PD 23 and the wiring layer-side PD 37. In addition, the p-type high-concentration impurity region constituting the photodiode separation region 40 also has the effect of suppressing a dark current due to defects in the side surface (interface of the semiconductor substrate 14) of the trench portion 20.

The wiring layer-side FD 36 includes an n-type high-concentration impurity region formed on the surface side of the semiconductor substrate 14 to be diagonal to the region where the buried FD 16 is formed within the photodiode region 12.

In addition, a wiring layer-side gate electrode 35 is formed on the semiconductor substrate 14 through a gate insulating film 34 to be disposed between the wiring layer-side PD 37 and the wiring layer-side FD 36. The wiring layer-side FD 36 and the wiring layer-side gate electrode 35 are connected to desired wirings 19, which are formed on the surface side of the semiconductor substrate 14, through contact portions 21. The wiring layer-side gate electrode 35 is formed in a region between the wiring layer-side FD 36 and the wiring layer-side PD 37 and constitutes a transfer transistor Tr2 for transferring signal charge generated in the wiring layer-side PD 37 to the wiring layer-side FD 36.

In the solid-state imaging device of this embodiment having the above-described configuration, signal charge generated and stored in the buried PD 23 is transferred to the buried FD 16 by applying a transfer voltage to the buried gate electrode 22 as shown by arrow $R_1$ in FIG. 16. In addition, signal charge generated and stored in the wiring layer-side PD 37 is transferred to the wiring layer-side FD 36 by applying a transfer voltage to the wiring layer-side gate electrode 35 as shown by arrow $R_2$ in FIG. 16.

In this case, different voltages may be applied to the buried gate electrode 22 and the wiring layer-side gate electrode 35 or the same voltage may be applied by electrically connecting the buried gate electrode 22 and the wiring layer-side gate electrode 35 through the wiring 19.

When different voltages are applied to the buried gate electrode 22 and the wiring layer-side gate electrode 35, signal charges of the buried PD 23 and the wiring layer-side PD 37 may be transferred to the buried FD 16 and the wiring layer-side FD 36, respectively, with different timings. Even when different voltages are applied to the buried gate electrode 22 and the wiring layer-side gate electrode 35, signal charges of the buried PD 23 and the wiring layer-side PD 37 may be transferred simultaneously.

When the buried gate electrode 22 and the wiring layer-side gate electrode 35 are connected to each other through the wiring 19, signal charges of the buried PD 23 and the wiring layer-side PD 37 are simultaneously transferred to the buried FD 16 and the wiring layer-side FD 36, respectively.

In the solid-state imaging device of this embodiment, the two photodiode layers including the wiring layer-side PD 37 and the buried PD 23 are formed within the photodiode region 12. Therefore, the high quantity ($Q_s$) of saturation electric charge may be achieved by adding signal charges produced in the two photodiodes.

Figure 17:
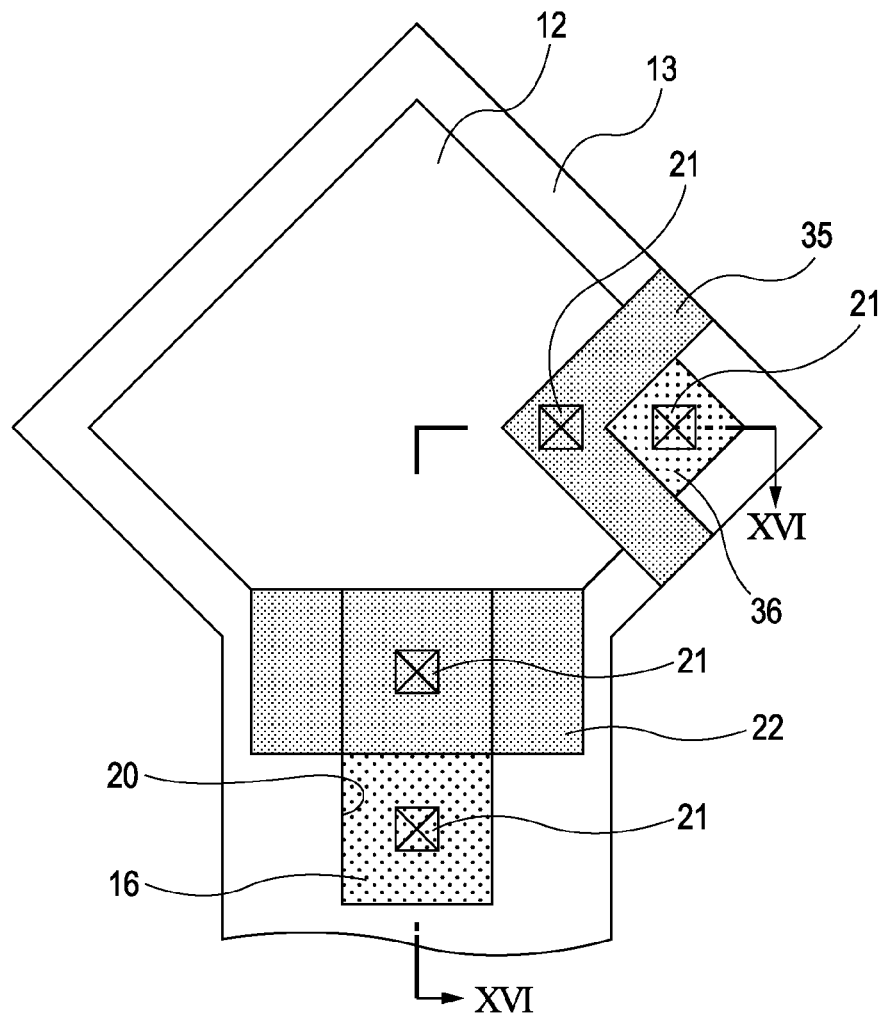
FIG. 17 is a plan view of a configuration of the solid-state imaging device according to the fourth embodiment of the present invention in the case where a wiring layer-side photodiode and a buried photodiode are formed at adjacent corners of a photodiode region.

In this embodiment, the buried FD 16 and the wiring layer-side FD 36 are formed on a diagonal of the photodiode region 12. However, as shown in FIG. 17, the buried FD 16 and the wiring layer-side FD 36 may be formed adjacent to each other. In this case, a sectional configuration taken along line XVI-XVI in FIG. 17 is the same as the configuration shown in FIG. 16.

When the two photodiode layers including the wiring layer-side PD 37 and the buried PD 23 are formed, vertical light dispersion may be made using the phenomenon that the light absorptance varies with wavelengths in the semiconductor substrate 14 in the depth direction thereof.

A solid-state imaging device using vertical light dispersion is described below in a fifth embodiment.

5. Fifth Embodiment

Figure 18:
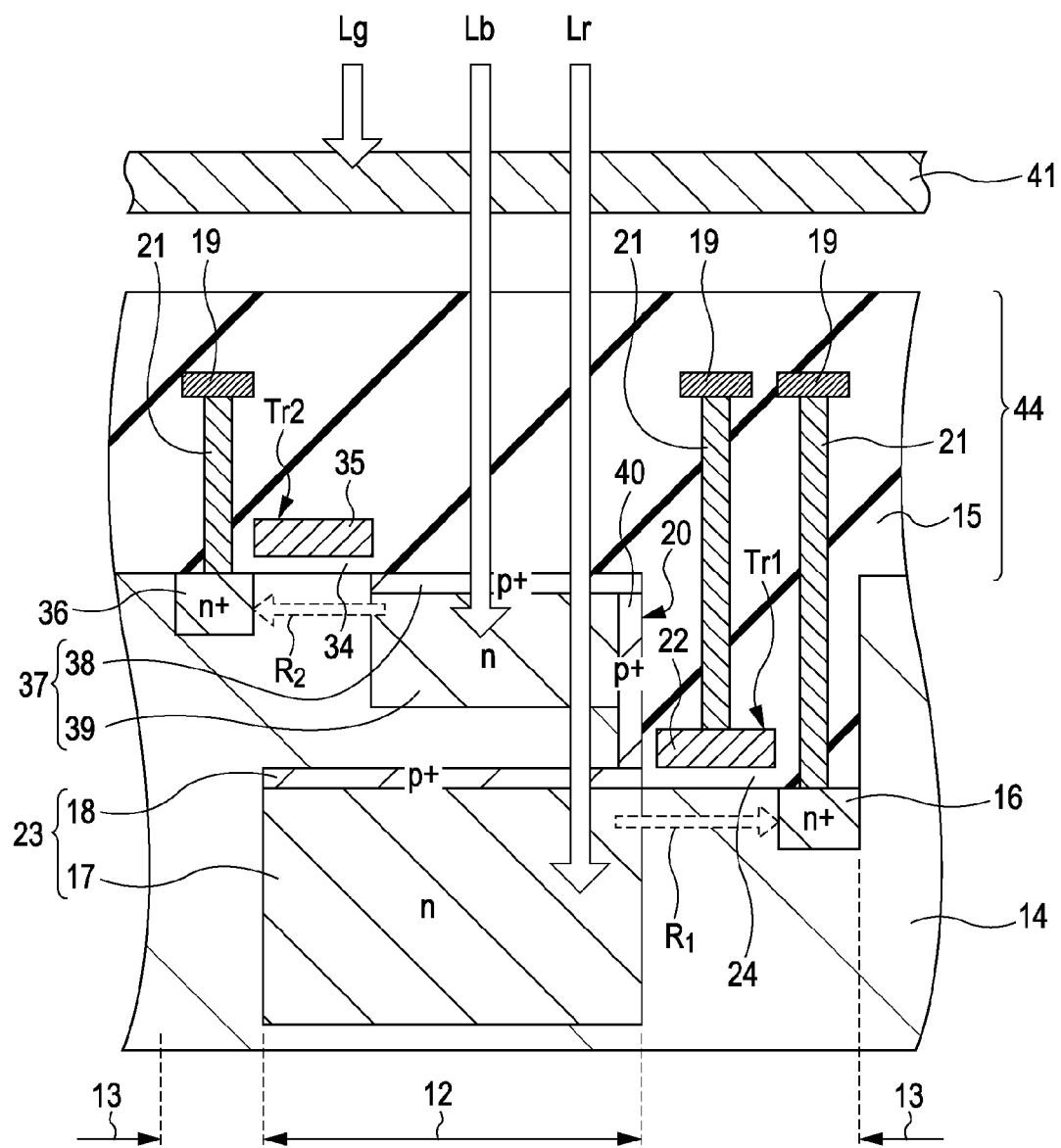
FIG. 18 is a schematic sectional view of a configuration of a principal portion of a solid-state imaging device according to a fifth embodiment of the present invention.

FIG. 18 shows a schematic sectional configuration of a solid-state imaging device according to a fifth embodiment of the present invention. Here, a front side-illumination type solid-state imaging device in which light is illuminated from the side of a semiconductor substrate where a wiring layer is formed is described as an example. Since the overall configuration of the solid-state imaging device according to the fifth embodiment is the same as in FIG. 1, duplicate description is omitted. In FIG. 18, portions corresponding to FIG. 16 are denoted by the same reference numerals, and duplicate description is omitted.

As shown in FIG. 18, an organic photoelectric conversion layer 41 which produces signal charge of green (G) light $L_g$ is formed above the wiring layer 44 on the light illumination side. In addition, the wiring layer-side PD 37 is formed in a region of 0.5 μm from an incidence surface of the semiconductor substrate 14 in order to produce signal charge of blue (B) light $L_b$. Further, for example, when the thickness of the semiconductor substrate 14 is 3 μm, the buried PD 23 is formed in a region of 0.5 μm to 3 μm from the incidence surface of the semiconductor substrate 14 in order to produce signal charge of red (R) light $L_r$. When the thickness of the semiconductor substrate 14 is more than 3 μm, a second buried PD 57 may be extended in the depth direction of the semiconductor substrate 14.

In the solid-state imaging device having the above-described configuration, in each of the pixels 2, signal charge of green (G) light $L_g$ is produced in the organic photoelectric conversion layer 41. In addition, signal charge of blue (B) light $L_b$ is produced in the wiring layer-side PD 37. Further, signal charge of red (R) light $L_r$ is produced in the buried PD 23. The signal charge produced in the organic photoelectric conversion layer 41 is transferred to a floating diffusion (not shown). The signal charge produced in the wiring layer-side PD 37 is transferred to the wiring layer-side FD 36. The signal charge produced in the buried PD 23 is transferred to the buried FD 16.

In the solid-state imaging device according to the fifth embodiment, one of the RGB lights is photoelectrically converted by the organic photoelectric conversion layer 41, and the remaining two colors are photoelectrically converted by the two respective photodiodes formed in layers in the semiconductor substrate 14. Therefore, incident light is dispersed in the vertical direction to separately produce RGB lights, and thus a color filter layer may not be provided. In addition, in the pixels 2, RGB lights are entirely photoelectrically converted, and the efficiency of light utilization per pixel is increased to 3 times as high as the dispersion using a color filter layer separately provided. Consequently, sensitivity is improved.

Although, in this embodiment, light absorbed in the organic photoelectric conversion layer 41 is green light $L_g$, red light $L_r$ may be absorbed. In this case, blue light $L_b$ may be absorbed by the wiring layer-side PD 37, and green light $L_g$ may be absorbed by the buried PD 23. In addition, blue light $L_b$ may be absorbed by the organic photoelectric conversion layer 41. In this case, green light $L_b$ may be absorbed by the wiring layer-side PD 37, and red light $L_r$ may be absorbed by the buried PD 23.

In the solid-state imaging device according to the fifth embodiment, green light $L_g$ is absorbed by the organic photoelectric conversion layer 41, and thus blue light $L_b$ and red light $L_r$ at separate wavelengths may be absorbed in the semiconductor substrate 14. Therefore, light separation is more securely performed in the semiconductor substrate 14.

The front side-illumination type solid-state imaging device is described as an example of the solid-state imaging device according to the fifth embodiment. However, the solid-state imaging device according to the fifth embodiment may be a back side-illumination type solid-state imaging device. In this case, the organic photoelectric conversion layer 41 is formed on the back side of the semiconductor substrate 14. In addition, light at a shorter wavelength may be absorbed by the buried PD 23 on the light incidence side, and light at a longer wavelength may be absorbed by the wiring layer-side PD 37 away from the light incidence side.

6. Sixth Embodiment

Solid-State Imaging Device

Next, a solid-state imaging device according to a sixth embodiment of the present invention is described.

Figure 19:
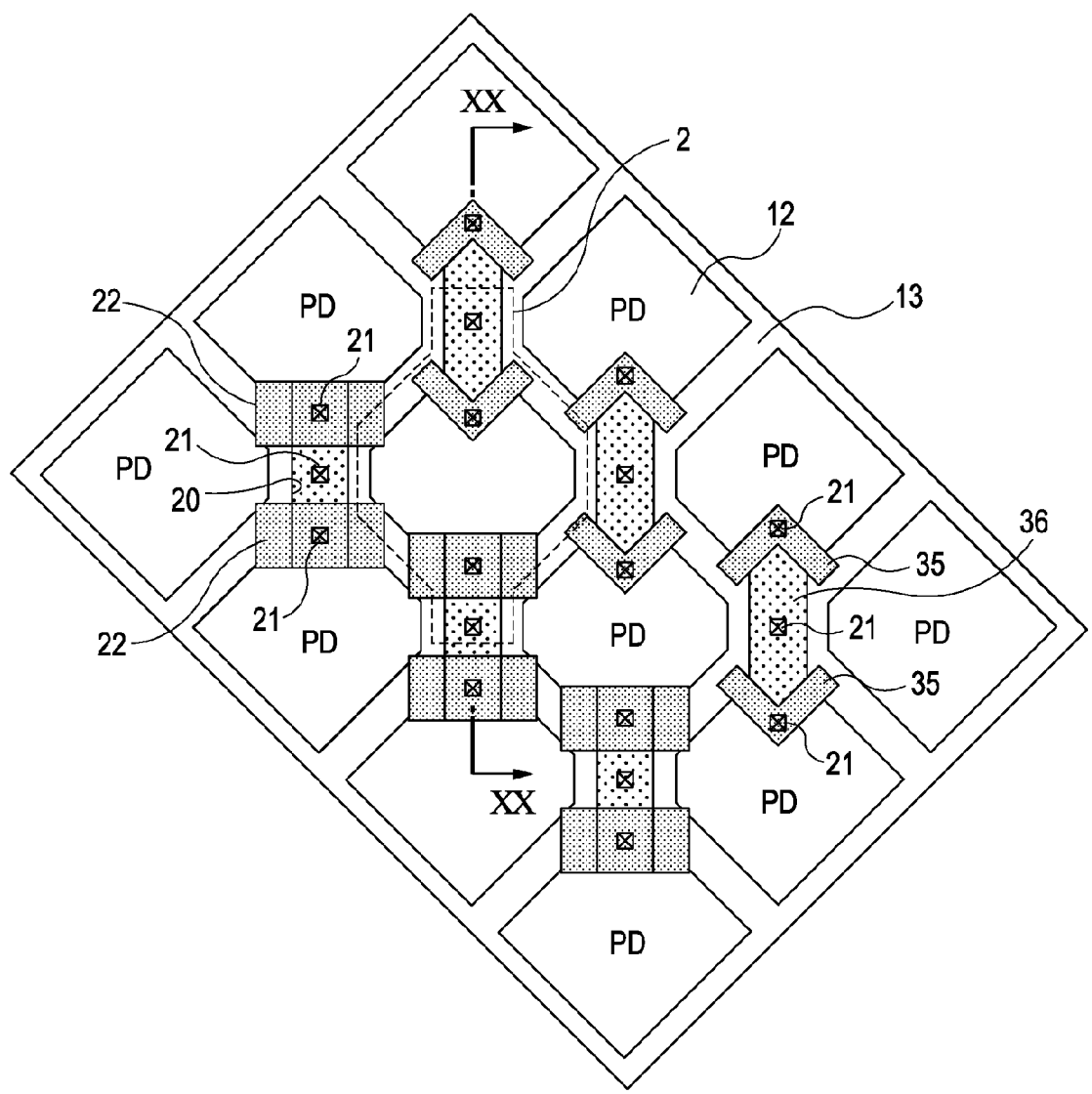
FIG. 19 is a plan view of a configuration of a principal portion of a solid-state imaging device according to a sixth embodiment of the present invention.
Figure 20:
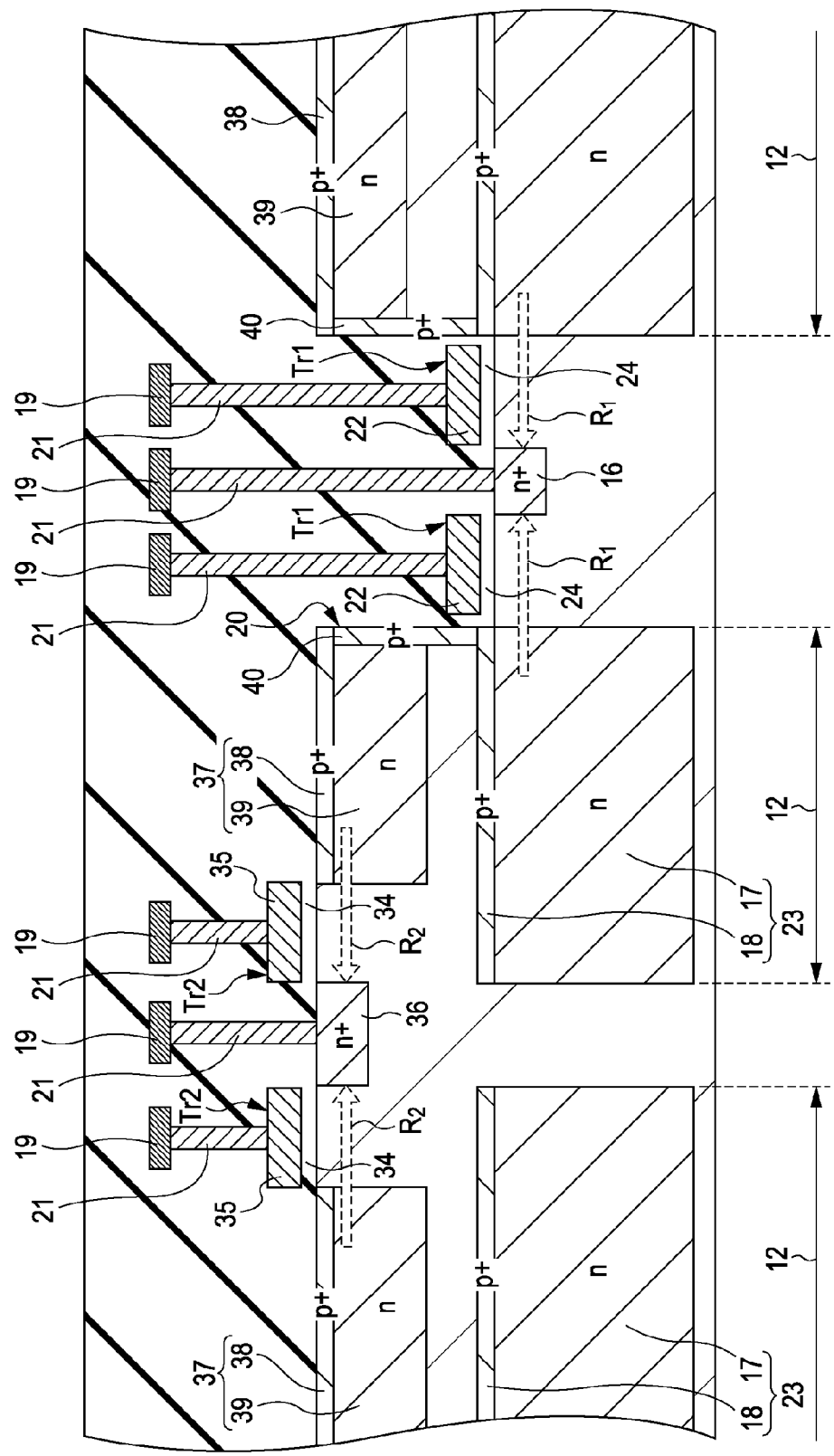
FIG. 20 is a sectional view of a configuration taken along line XX-XX in FIG. 19.

FIG. 19 is a schematic plan view of a configuration a principal portion of the solid-state imaging device according to the sixth embodiment of the present invention, and FIG. 20 is a schematic sectional view of a configuration taken along line XX-XX in FIG. 19. Since the overall configuration of the solid-state imaging device according to the sixth embodiment is the same as in FIG. 1, duplicate description is omitted. In FIGS. 19 and 20, portions corresponding to FIGS. 15 and 16 are denoted by the same reference numerals, and duplicate description is omitted.

In the solid-state imaging device according to the sixth embodiment, the wiring layer-side FD 36 and the buried FD 16 are provided in common to the adjacent pixels.

In regard to one pixel 2, as shown in FIG. 19, the buried FD 16 and the wiring layer-side FD 36 are formed on a diagonal of the photodiode region 12. The buried FD 16 is common to the pixel 2 and one of the pixels 2 adjacent thereto, and the wiring layer-side FD 36 is common to the pixel 2 and the other of the pixels 2 adjacent thereto. That is, the wiring layer-side FD 36 and the buried FD 16 are provided in common to the adjacent pixels in different directions.

In this case, the method for forming the common buried FD 16 is the same as in the second embodiment and is thus not described.

The wiring layer-side FD 36 is, as shown in FIG. 20, formed in a region between two wiring layer-side PDs 37 formed in a pixel 2 and a pixel 2 adjacent thereto. In addition, wiring layer-side gate electrodes 35 are formed between the wiring layer-side FD 36 and the wiring layer-side PDs 37 of the respective pixels 2. Therefore, when a desired voltage is applied to the wiring layer-side gate electrodes 35, signal charges produced in the wiring layer-side PDs 37 are transferred to the wiring layer-side FD 36 common to the adjacent pixels through transfer paths shown by arrows $R_2$. In addition, signal charges are transferred with different timings from the wiring layer-side PDs 37 of the respective pixels 2 to the wiring layer-side FD 36 common to the adjacent pixels.

In the solid-state imaging device according to the sixth embodiment, the wiring layer-side FD 36 and the buried FD 16 are provided in common to the adjacent pixels 2. Therefore, an area for forming the wiring layer-side FD 36 and the buried FD 16 may be decreased, thereby exhibiting the effect of permitting reduction in pixel size and the same effect as in the second embodiment.

7. Sixth Embodiment

Solid-State Imaging Device

Next, a solid-state imaging device according to a seventh embodiment of the present invention is described.

Figure 21:
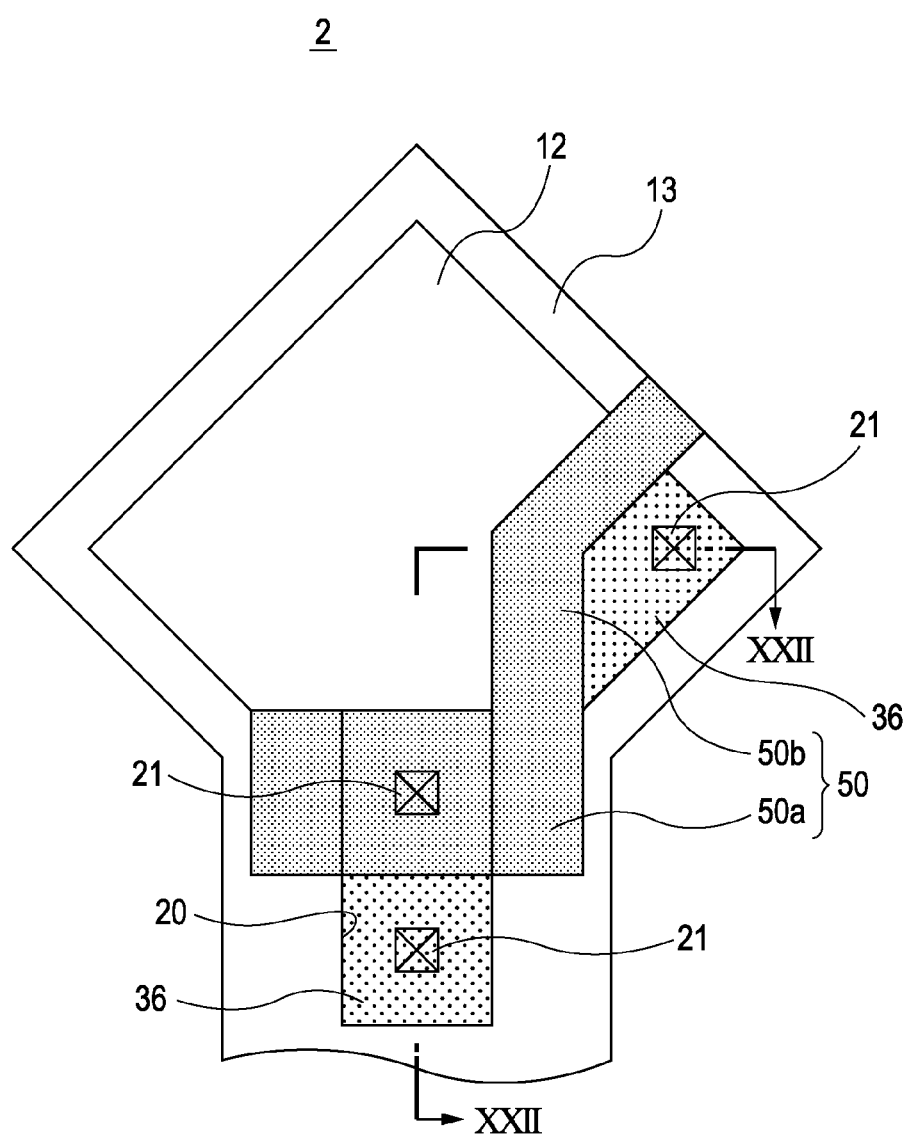
FIG. 21 is a schematic plan view of a configuration of a principal portion of a solid-state imaging device according to a seventh embodiment of the present invention.
Figure 22:
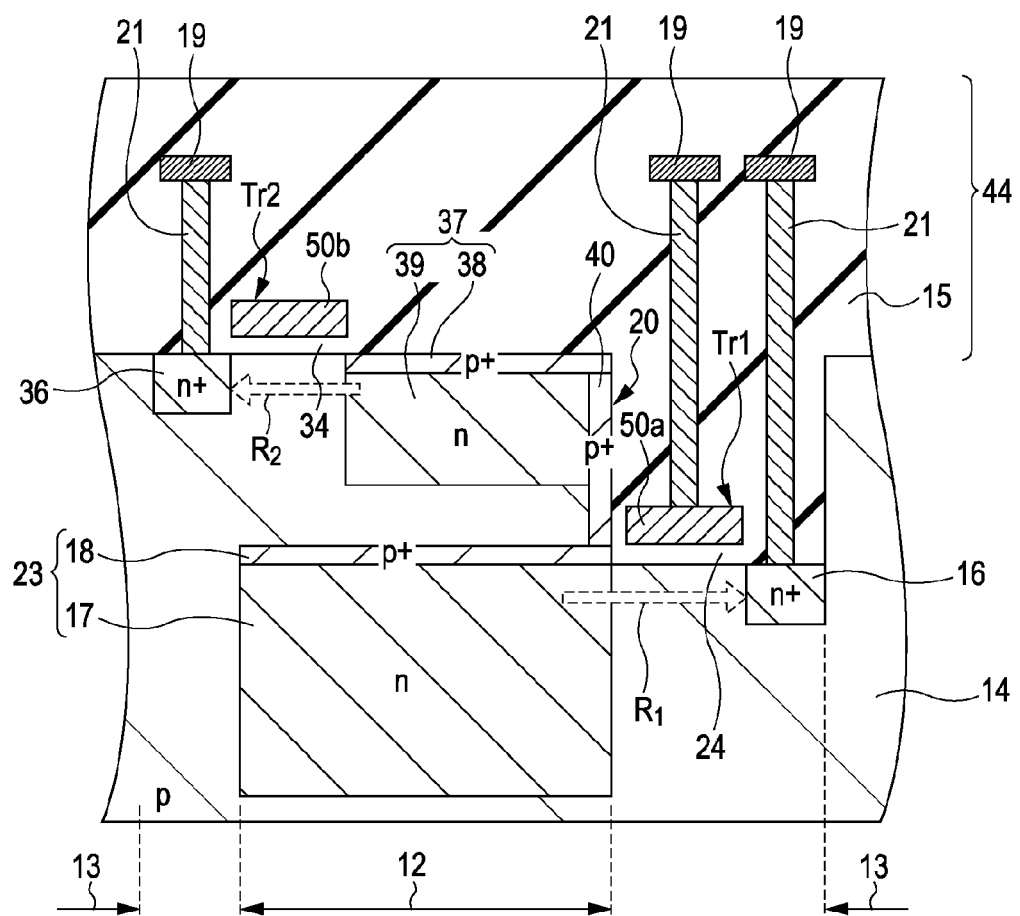
FIG. 22 is a sectional view of a configuration taken along line XXII-XXII in FIG. 21.

FIG. 21 is a schematic plan view of a configuration a principal portion of the solid-state imaging device according to the seventh embodiment of the present invention, and FIG. 22 is a schematic sectional view of a configuration taken along line XXII-XXII in FIG. 21. Since the overall configuration of the solid-state imaging device according to the seventh embodiment is the same as in FIG. 1, duplicate description is omitted. In FIGS. 21 and 22, portions corresponding to FIGS. 15 and 16 are denoted by the same reference numerals, and duplicate description is omitted.

In the solid-state imaging device according to the seventh embodiment, a buried gate electrode 50*a* and a wiring layer-side gate electrode 50*b* are formed to be connected to each other in each pixel.

In the solid-state imaging device according to the seventh embodiment, as shown in FIG. 21, the buried gate electrode 50*a* and the wiring layer-side gate electrode 50*b*, which are composed of polysilicon, are integrally formed in one pixel to form a buried gate electrode/wiring layer-side gate electrode 50. That is, one gate electrode constitutes the buried gate electrode 50*a* and the wiring layer-side gate electrode 50*b*. In a configuration in which the buried gate electrode 50*a* and the wiring layer-side gate electrode 50*b* are connected to each other, as shown in FIG. 21, the buried FD 16 and the wiring layer-side FD 36 are preferably provided at the respective adjacent corners in each pixel 2. When the buried FD 16 and the wiring layer-side FD 36 are provided at the respective adjacent corners in each pixel 2, the distance between both is decreased, and thus the buried gate electrode 50*a* and the wiring layer-side gate electrode 50*b* are easily integrally formed.

In addition, as shown in FIG. 22, the buried gate electrode/wiring layer-side gate electrode 50 is connected to the wiring 19 of the wiring layer 44 through the contact portion 21 formed, for example, on the buried gate electrode 50*a* side. In this case, since the buried gate electrode 50*a* and the wiring layer-side gate electrode 50*b* are formed to be connected to each other, one contact portion 21 may be formed for the buried gate electrode/wiring layer-side gate electrode 50 formed for one pixel 2.

In the solid-state imaging device according to the seventh embodiment having the above-described configuration, the buried gate electrode 50*a* and the wiring layer-side gate electrode 50*b* in each pixel are constantly maintained at the same potential. When a desired transfer voltage is applied to the buried gate electrode/wiring layer-side gate electrode 50, signal charges stored in the buried PD 23 and the wiring layer-side PD 37 are transferred with the same timing to the buried FD 16 and the wiring layer-side FD 36, respectively.

In the solid-state imaging device according to the seventh embodiment, the buried gate electrode 50*a* and the wiring layer-side gate electrode 50*b* are formed to be connected to each other. Therefore, it may be unnecessary to separately form contact portions 21 for the buried gate electrode 50*a* and the wiring layer-side gate electrode 50*b*, thereby decreasing the number of the contact portions 21.

In addition, the same effect as in the fifth embodiment may be achieved.

8. Eighth Embodiment

Solid-State Imaging Device

Next, a solid-state imaging device according to an eighth embodiment of the present invention is described.

Figure 23:
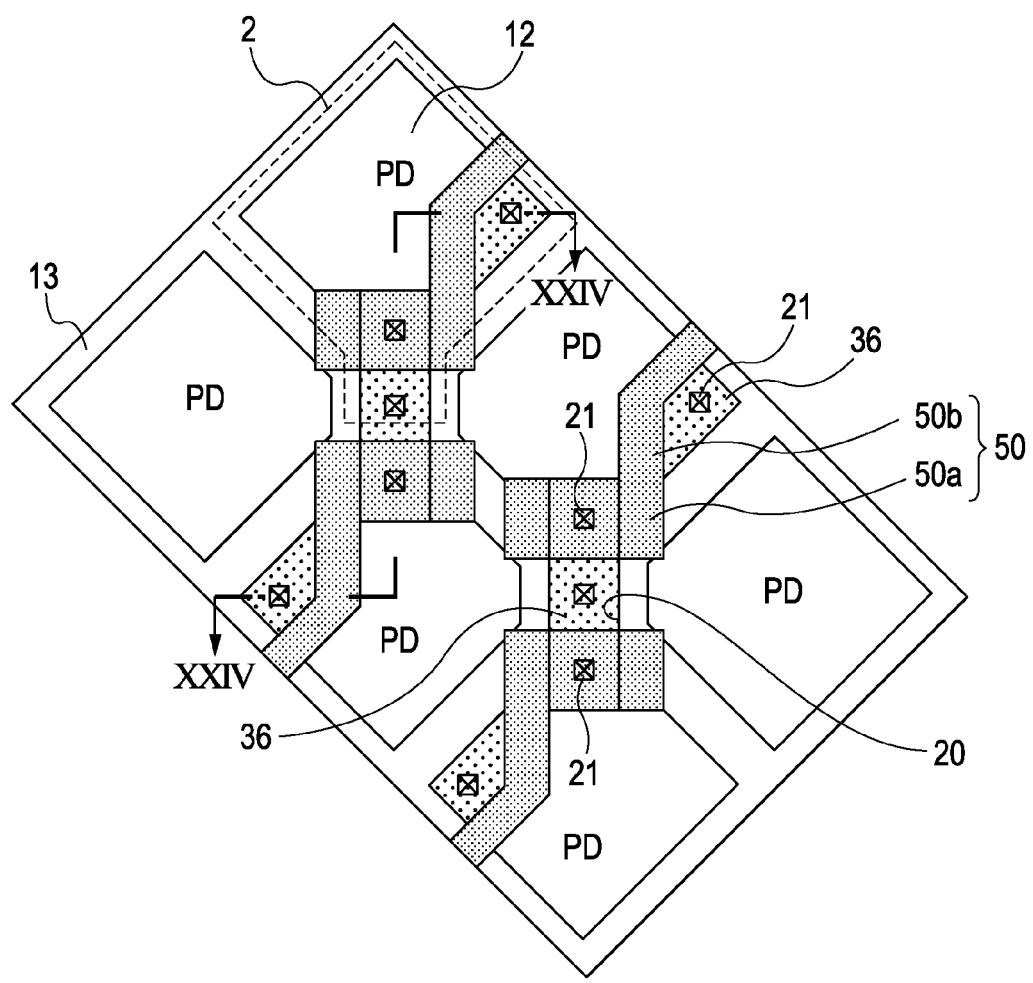
FIG. 23 is a schematic plan view of a configuration of a principal portion of a solid-state imaging device according to an eighth embodiment of the present invention.
Figure 24:
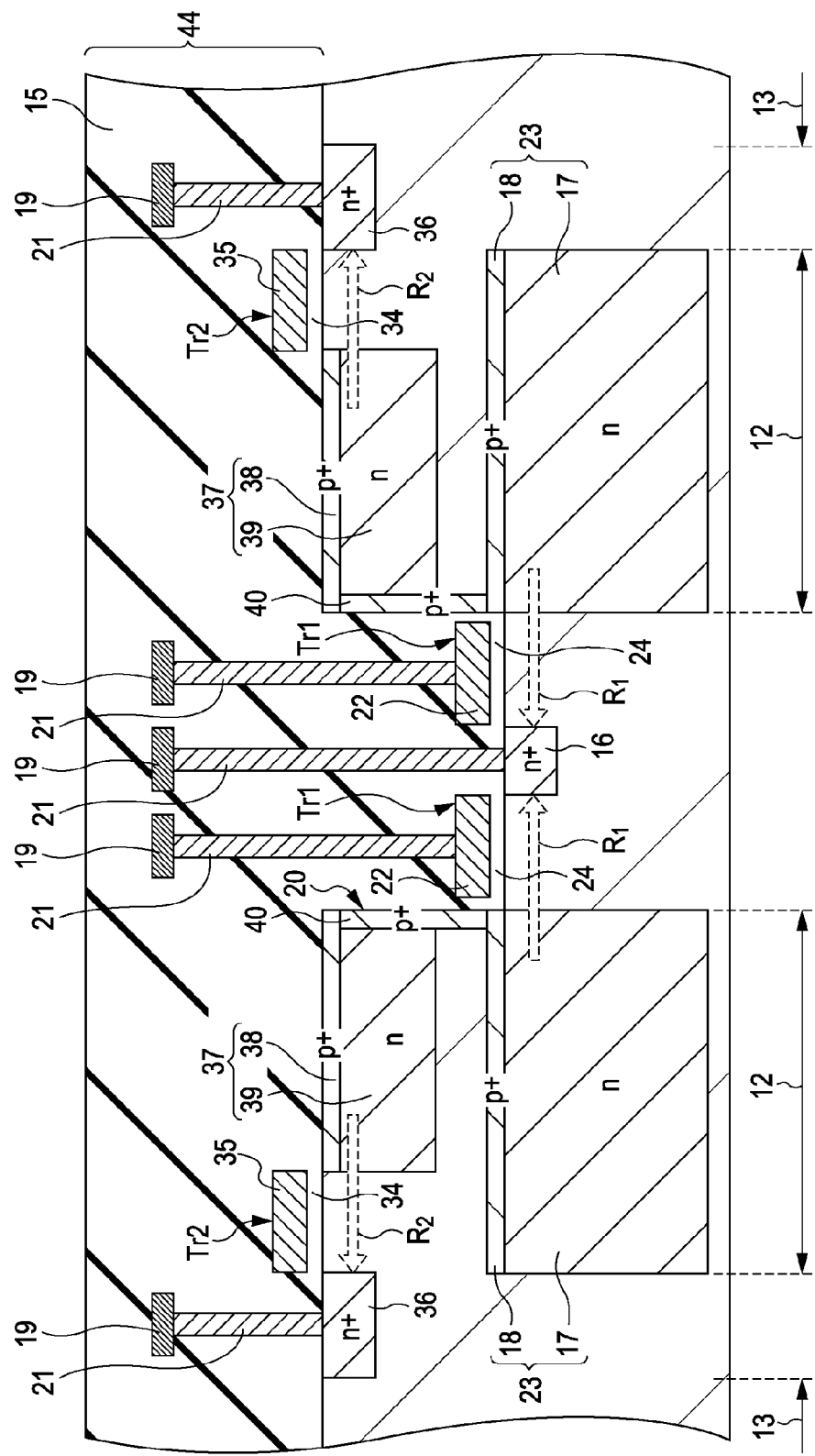
FIG. 24 is a sectional view of a configuration taken along line XXIV-XXIV in FIG. 23.

FIG. 23 is a schematic plan view of a configuration a principal portion of the solid-state imaging device according to the eighth embodiment of the present invention, and FIG. 24 is a schematic sectional view of a configuration taken along line XXIV-XXIV in FIG. 23. Since the overall configuration of the solid-state imaging device according to the eighth embodiment is the same as in FIG. 1, duplicate description is omitted. In FIGS. 23 and 24, portions corresponding to FIGS. 21 and 22 are denoted by the same reference numerals, and duplicate description is omitted.

In the solid-state imaging device according to the eighth embodiment, the buried FD 16 in the solid-state imaging device according to the seventh embodiment is formed in common to the two adjacent pixels.

In the solid-state imaging device according to the eighth embodiment, as shown in FIGS. 23 and 24, the buried gate electrode 50*a* and the wiring layer-side gate electrode 50*b* are formed to be connected to each other in one pixel 2. In addition, the buried FD 16 is formed in common to the two adjacent pixels 2.

In the solid-state imaging device according to the eighth embodiment, one buried FD 16 may be formed for two pixels, thereby decreasing the formation area of the buried FD 16. Further, the buried gate electrode 50*a* and the wiring layer-side gate electrode 50*b* are integrally formed in one pixel, and thus the contact portion 21 for applying a desired voltage to the buried gate electrode/wiring layer-side gate electrode 50 may be formed at one position, thereby decreasing the number of the contact portions 21.

In addition, the same effect as in the first and fourth embodiments is exhibited.

9. Ninth Embodiment

Solid-State Imaging Device

Next, a solid-state imaging device according to a ninth embodiment of the present invention is described.

Figure 25:
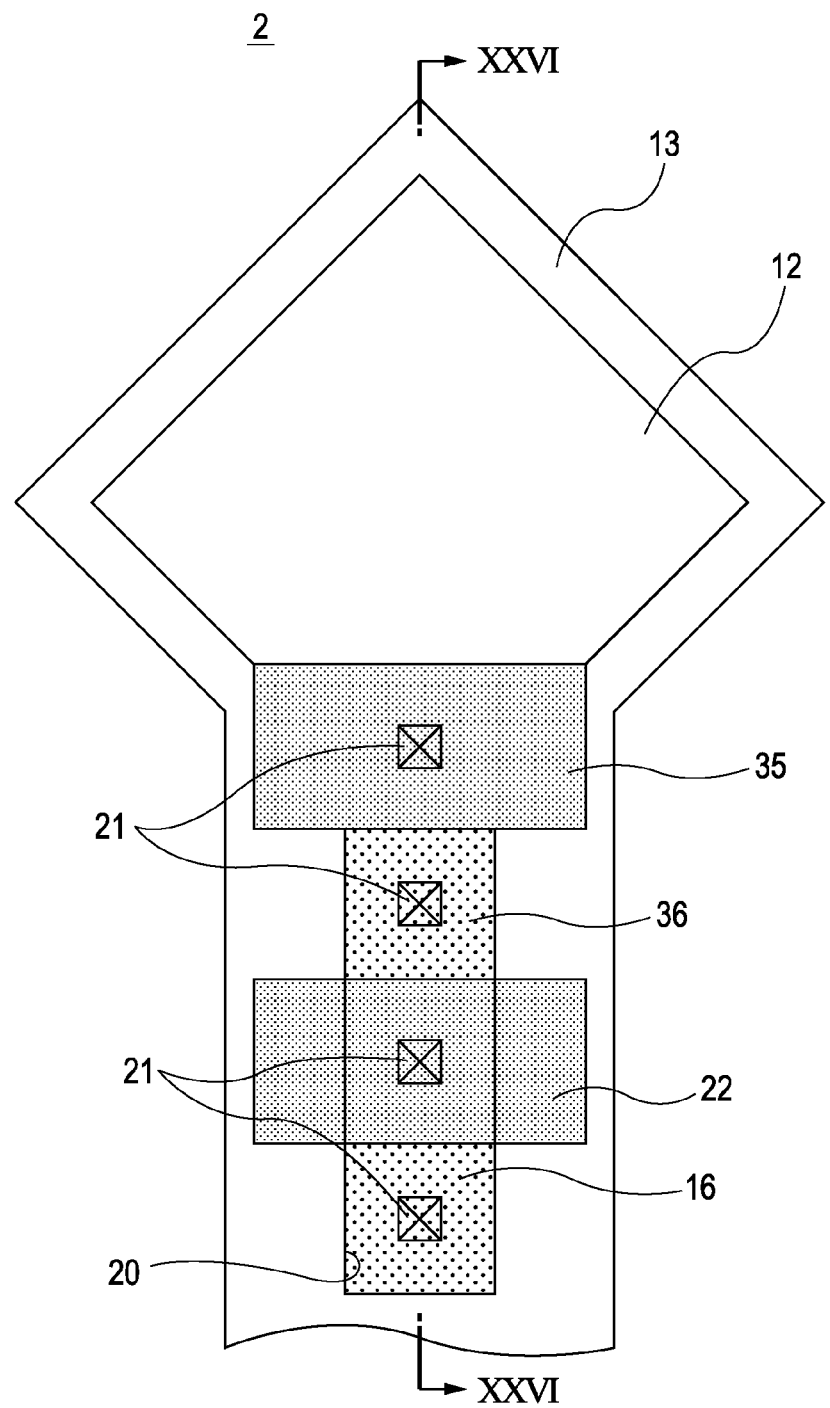
FIG. 25 is a schematic plan view of a configuration of a principal portion of a solid-state imaging device according to a ninth embodiment of the present invention.
Figure 26:
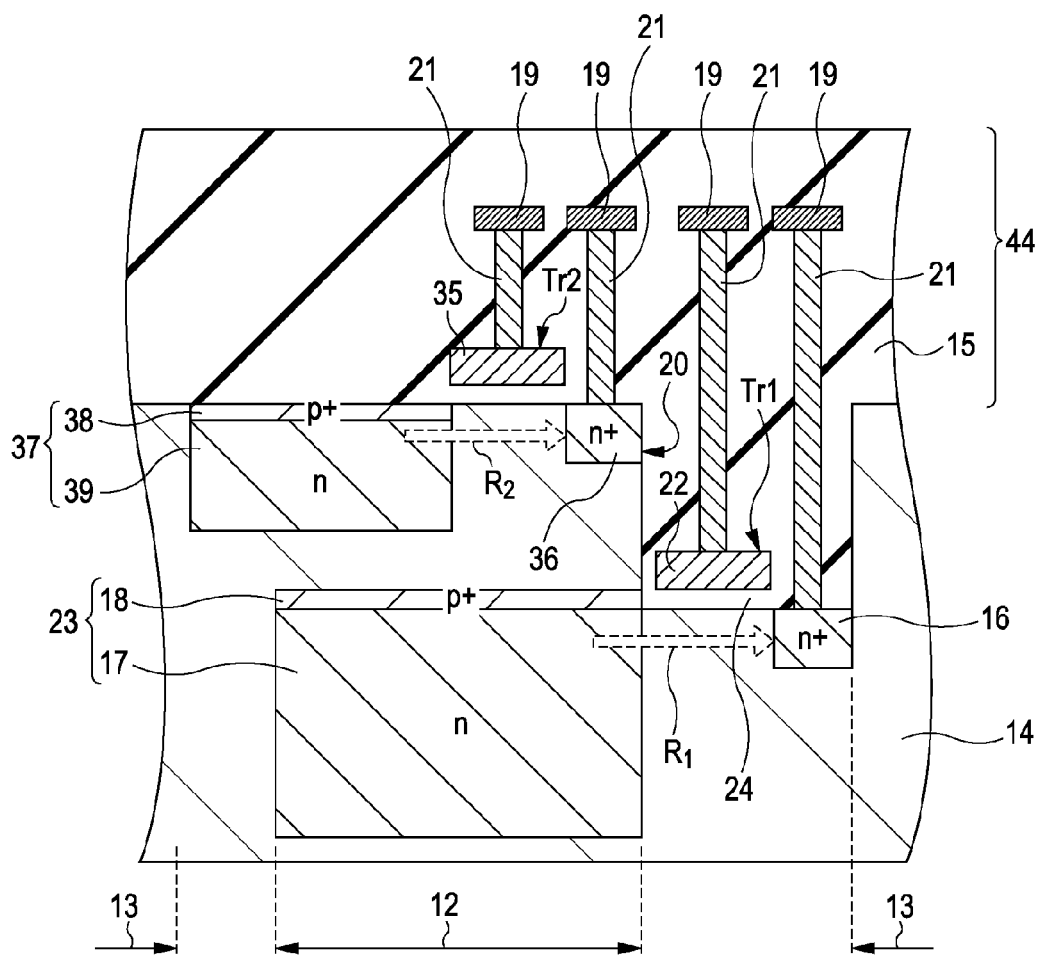
FIG. 26 is a sectional view of a configuration taken along line XXVI-XXVI in FIG. 25.

FIG. 25 is a schematic plan view of a configuration a principal portion of the solid-state imaging device according to the ninth embodiment of the present invention, and FIG. 26 is a schematic sectional view of a configuration taken along line XXVI-XXVI in FIG. 25. Since the overall configuration of the solid-state imaging device according to the ninth embodiment is the same as in FIG. 1, duplicate description is omitted. In FIGS. 25 and 26, portions corresponding to FIGS. 15 and 16 are denoted by the same reference numerals, and duplicate description is omitted.

In the solid-state imaging device according to the ninth embodiment, the wiring layer-side FD 36 and the buried FD 16 in the solid-state imaging device according to the fourth embodiment are formed in the same direction with respect to the photodiode region 12.

In the solid-state imaging device according to the ninth embodiment, as shown in FIG. 26, the reading direction of signal charge from the buried PD 27 and the reading direction of signal charge from the wiring layer-side PD 37 are the same as shown by arrows $R_1$ and $R_2$. Therefore, the transfer transistor Tr1 formed in the buried PD 27 and the transfer transistor Tr2 formed in the wiring layer-side PD 37 may be formed with a short distance therebetween, thereby facilitating wiring and providing a configuration advantageous for reduction in pixel size.

Figure 27:
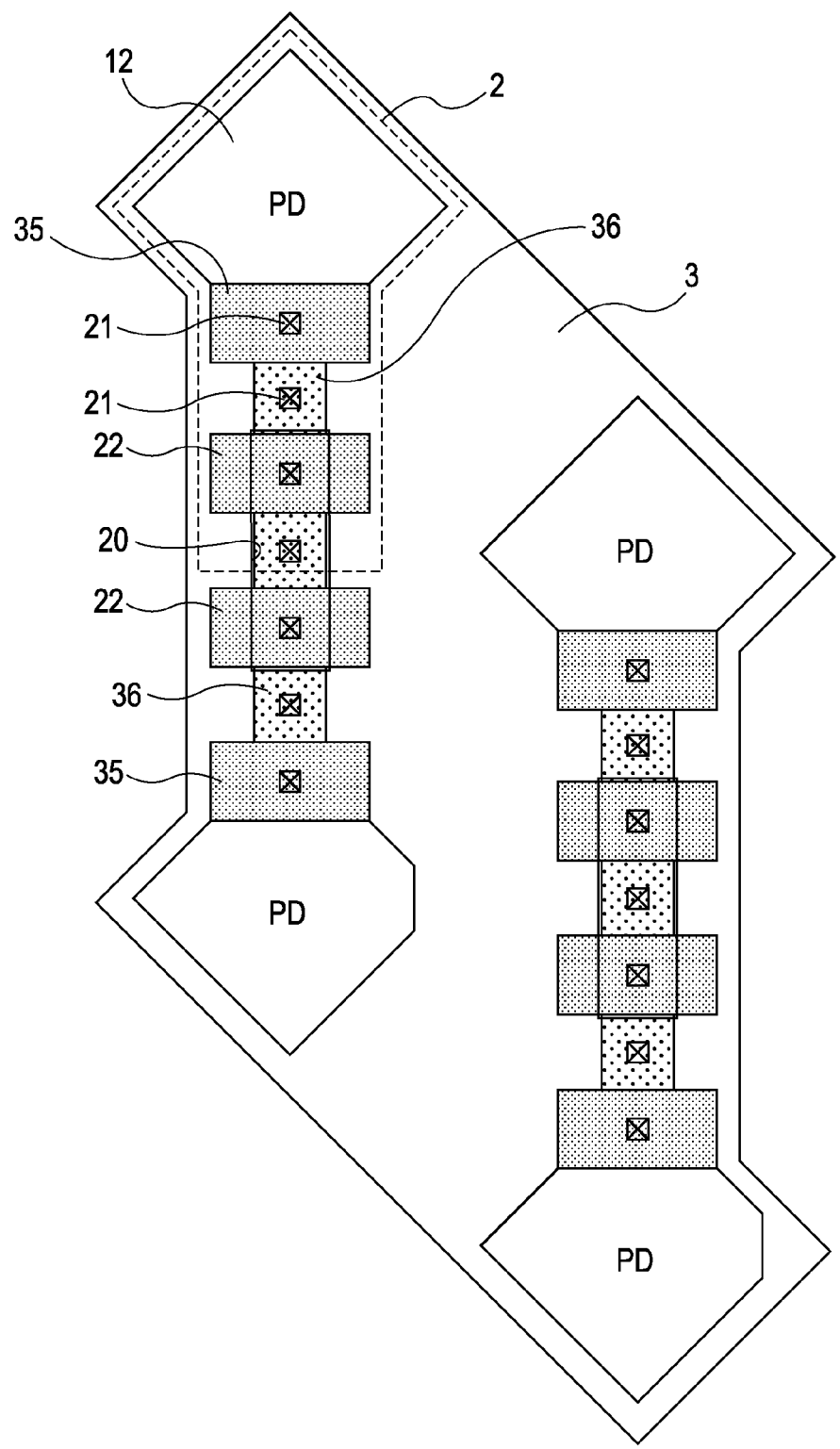
FIG. 27 is a schematic plan view of a configuration of the ninth embodiment of the present invention in which a buried photodiode is provided in common.

In addition, in the solid-state imaging device according to the ninth embodiment, as shown in FIG. 27, the buried FD 16 may be formed in common to the adjacent pixels 2.

10. Tenth Embodiment

Solid-State Imaging Device

Next, a solid-state imaging device according to a tenth embodiment of the present invention is described.

FIG. 28 is a schematic plan view of a configuration a principal portion of the solid-state imaging device according to the tenth embodiment of the present invention, and FIG. 29 is a schematic sectional view of a configuration taken along line XXIX-XXIX in FIG. 28. Since the overall configuration of the solid-state imaging device according to the tenth embodiment is the same as in FIG. 1, duplicate description is omitted. In FIGS. 28 and 29, portions corresponding to FIGS. 15 and 16 are denoted by the same reference numerals, and duplicate description is omitted.

In the solid-state imaging device according to the tenth embodiment, two layers of buried photodiodes are formed in the solid-state imaging device according to the fourth embodiment.

In the solid-state imaging device according to the tenth embodiment, as shown in FIGS. 28 and 29, three photodiodes including a first buried PD 23, a second buried PD 57, and a wiring layer-side PD 37 are formed in each photodiode region 12. Namely, the solid-state imaging device according to the tenth embodiment includes the three steps of photodiodes formed in the photodiode region 12.

The first buried PD 23 has, for example, the same configuration as the buried PD 23 of the first embodiment. In addition, the second buried PD 57 is formed below the first buried PD 23 and includes a pn junction between a p-type high-concentration impurity region 58 and an n-type impurity region 59.

In addition, a first buried FD 16 and a first buried gate electrode 22 are formed for the first buried PD 23, and a second buried FD 56 and a second buried gate electrode 55 are formed for the second buried PD 57.

The first buried FD 16 and the second buried FD 56 are formed in the semiconductor substrate 14 so as to face the bottoms of the respective steps of a trench portion 53 formed in a stepped shape. The first step of the stepped trench portion 53 is formed at the same depth as the first buried PD 23, and the second step is formed at the same depth as the second buried PD 57.

Therefore, the first buried FD 16 is formed in the semiconductor substrate 14 so as to face the bottom of the first step of the stepped trench portion 53. In addition, the second buried FD 56 is formed in the semiconductor substrate 14 so as to face the bottom (lowest) of the second step of the stepped trench portion 53.

In addition, a separation region 60 including a p-type high-concentration impurity region is formed between the first buried FD 16 and the second buried PD 57. The separation region 60 prevents the signal charge of the second buried PD 57 from leaking to the first buried FD 16. Although, in the example shown in FIG. 29, the separation region 60 is formed only below the first buried FD 16, the separation region 60 may be formed between the first buried PD 23 and the second buried PD 57.

The first buried gate electrode 22 is formed, through a gate insulating film 24, on a region of the semiconductor substrate 14 between the first buried PD 23 and the first buried FD 16, the region including the bottom of the first step of the trench portion 53. The first buried gate electrode 22 constitutes a transfer transistor Tr1 for transferring signal charge stored in the first buried PD 23 to the first buried FD 16.

The second buried gate electrode 55 is formed, through the gate insulating film 54, on a region of the semiconductor substrate 14 between the second buried PD 57 and the second buried FD 56, the region including the bottom (lowest) of the second step of the trench portion 53. The second buried gate electrode 55 constitutes a transfer transistor Tr3 for transferring signal charge stored in the second buried PD 57 to the second buried FD 56.

In the solid-state imaging device according to the tenth embodiment, the signal charge produced and stored in the wiring layer-side PD 37 is transferred to the wiring layer-side FD 36 through a transfer path shown by arrow $R_2$. In addition, the signal charge produced and stored in the first buried PD 23 is transferred to the first buried FD 16 through a transfer path shown by arrow $R_1$. Further, the signal charge produced and stored in the second buried PD 57 is transferred to the second buried FD 56 through a transfer path shown by arrow $R_3$.

As described above, the trench portion formed in plural steps corresponding to the depths of buried PDs so that signal charges of a plurality of steps of buried PDs may be transferred to buried FDs formed at the same depths as the respective buried PDs.

Although, in the solid-state imaging device according to the tenth embodiment, two steps of buried PDs including the first buried PD 23 and the second buried PD 57 are formed, two or more buried PDs may be formed.

In the solid-state imaging device according to the tenth embodiment, a plurality of steps of photodiodes may be formed in the photodiode region 12 of each pixel 2, thereby increasing the quantity (Qs) of saturation electric charge per pixel. In addition, the signal charge produced and stored in a buried PD formed in the semiconductor substrate 14 is transferred to a buried FD formed at a depth equal to the depth of the buried PD, and thus transfer residue may be decreased due to the short transfer path.

The solid-state imaging device according to the tenth embodiment may be formed as a solid-state imaging device capable of vertical light dispersion.

When the solid-state imaging device according to the tenth embodiment is used as a front side-illumination type solid-state imaging device capable of vertical light dispersion, the wiring layer-side PD 36 is formed in a region of about 0.5 μm from an incidence surface of the semiconductor substrate 14 in order to produce signal charge of blue (B) light. Further, the first buried PD 23 is formed in a region of about 0.5 μm to 1.5 μm from the incidence surface of the semiconductor substrate 14 in order to produce signal charge of green (G) light. For example, when the total thickness of the semiconductor substrate 14 is 3 μm, the second buried PD 57 is formed in a region of about 1.5 μm to 3 μm from the incidence surface of the semiconductor substrate 14 in order to produce signal charge of red (R) light. When the thickness of the semiconductor substrate 14 is more than 3 μm, the second buried PD 57 may be extended in the depth direction of the semiconductor substrate 14.

In use as the solid-state imaging device capable of vertical light dispersion, a color filter layer may not be provided on the illumination side of the semiconductor substrate 14. In addition, in each pixel 2, RGB lights are entirely photoelectrically converted, and the efficiency of light utilization per pixel is increased to 3 times as high as the dispersion using a color filter layer. Consequently, sensitivity is improved.

In the solid-state imaging device according to the tenth embodiment, the wiring layer-side gate electrode 35, the first buried gate electrode 22, and the second buried gate electrode 55 may be integrally formed to be maintained at the same potential. Alternatively, the wiring layer-side gate electrode 35, the first buried gate electrode 22, and the second buried gate electrode 55 may be separately formed to be controlled at respective potentials. The wiring layer-side gate electrode 35, the first buried gate electrode 22, and the second buried gate electrode 55 may be separately formed and connected with each other through the wiring 19 so as to be maintained at the same potential.

In addition, like in the sixth embodiment, in the solid-state imaging device according to the tenth embodiment, the wiring layer-side FD 36 and the second buried FD 16 may be formed in common to the adjacent pixels.

Figure 30:
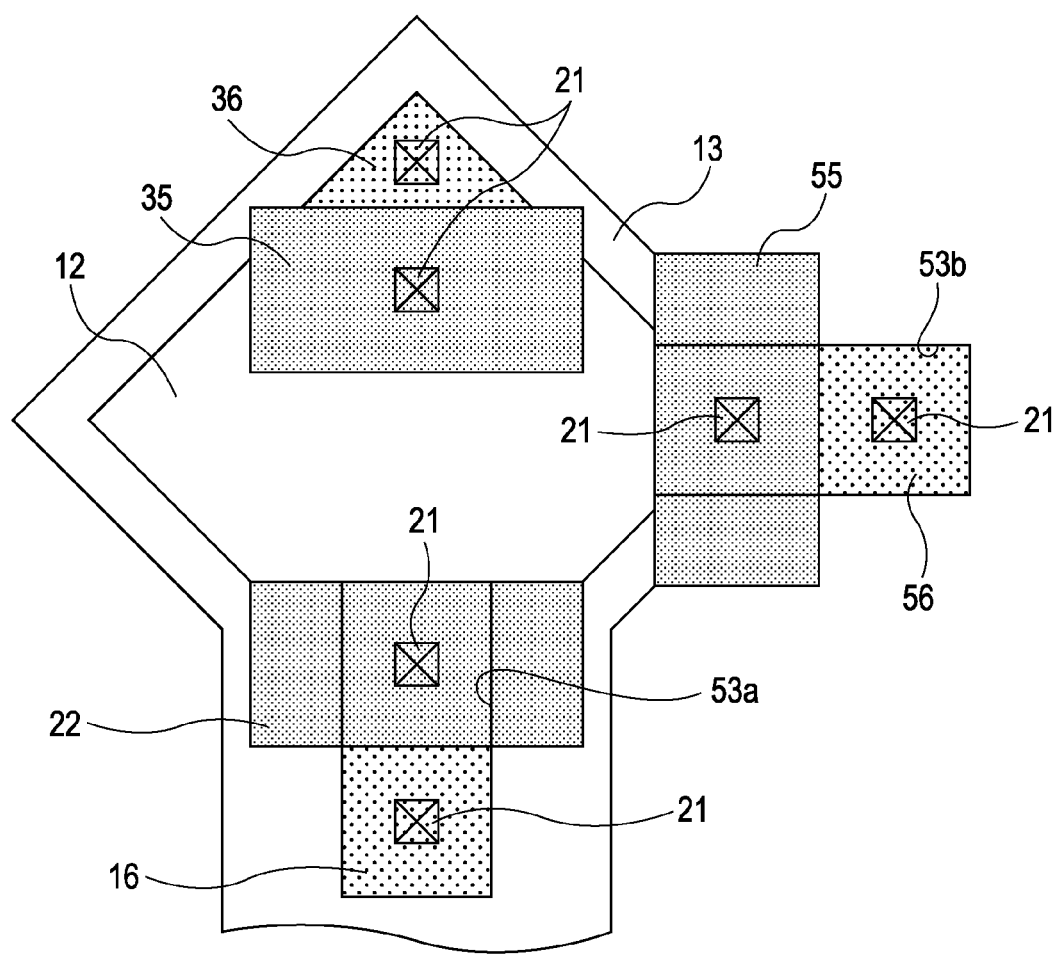
FIG. 30 is a drawing showing an example of a planar layout of a solid-state imaging device.

In addition, like in the solid-state imaging device according to the tenth embodiment, when the three photodiode layers are formed in the semiconductor substrate 14, various configurations may be used as a planar layout of a pixel. FIG. 30 shows an example of the planar layout of the solid-state imaging device according to the tenth embodiment.

In FIG. 30, the wiring layer-side FD 36, the first buried FD 16, and the second buried FD 56 are formed in different directions with respect to the photodiode region 12. In this case, the first buried FD 16 and the first buried gate electrode 22 are formed in a first trench portion 53a, and the second buried FD 56 and the second buried gate electrode 55 are formed in a second trench portion 53b.

Figure 31:
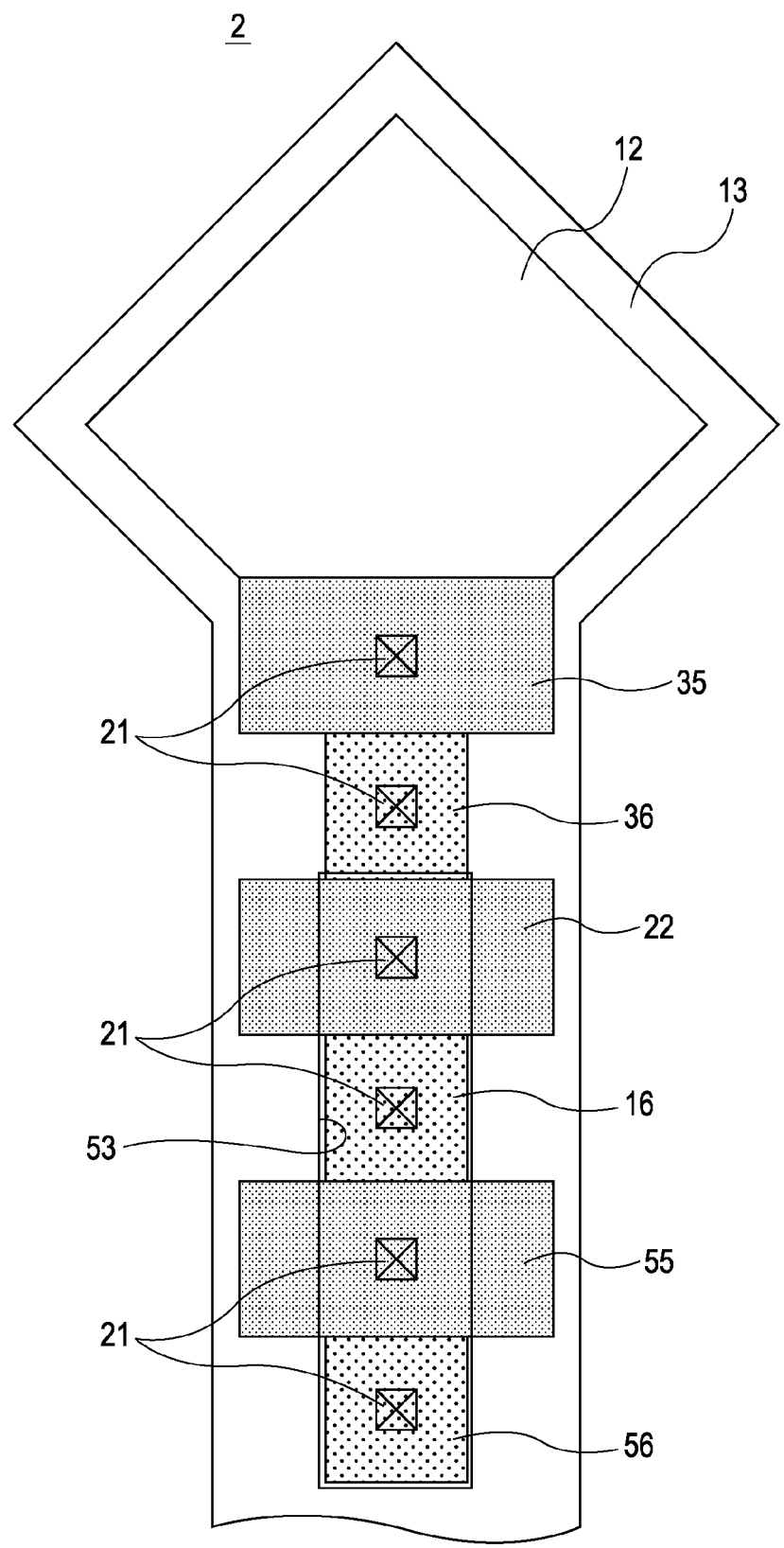
FIG. 31 is a drawing showing another example of a planar layout of a solid-state imaging device.

Further, FIG. 31 shows another example of the planar layout of the solid-state imaging device according to the tenth embodiment. In FIG. 31, the wiring layer-side FD 36, the first buried FD 16, and the second buried FD 56 are formed in the same direction with respect to the photodiode region 12. In this case, the first buried FD 16, the first buried gate electrode 22, the second buried FD 56, and the second buried gate electrode 55 are formed in the same trench portion 53 formed in common. In addition, the configuration of the trench portion 53 may be the same as the trench portion shown in FIG. 29.

In the above-described first to tenth embodiments, application to the CMOS solid-state imaging device in which unit pixels, which detect, as a physical amount, signal charge according to the quantity of incident light, are arranged in a matrix is described as an example. However, application of the present invention is not limited to the CMOS solid-state imaging device. Also, application of the present invention is not limited to column-type solid-state imaging devices in general, in which a column circuit is disposed for each pixel column of a pixel portion including pixels which are formed in a two-dimensional matrix.

In addition, application of the present invention is not limited to a solid-state imaging device in which an image is taken by detecting a distribution of quantities of incident visible light. The present invention may be applied to a solid-state imaging device in which an image is taken by detecting a distribution of quantities of incident infrared light, X-ray, particles, or the like. In a broad sense, the present invention may be applied to solid-state imaging devices (physical quantity distribution detecting device) in general, such as a fingerprint sensor and the like, in which an image is taken by detecting a distribution of other physical quantities such as pressure, capacitance, or the like.

Further, application of the present invention is not limited to a solid-state imaging device in which a pixel signal is read from each of unit pixels by successively scanning, in units of lines, the unit pixels of a pixel portion. The present invention may be applied to an X-Y address-type solid-state imaging device in which a desired pixel is selected in units of pixels, and a signal is read from the selected pixel in units of pixels.

The solid-state imaging device may be formed as one chip or a module form with an imaging function in which a pixel portion and a signal processing portion or an optical system are packaged together.

In addition, embodiments of the present invention are not limited to the above-described first to tenth embodiments, and combinations thereof and various modifications may be made. The above-described embodiments mainly relate to n-channel MOS transistors, but p-channel MOS transistors may be used. In the case of p-channel transistors, the conductivity types shown in each of the drawings are reversed.

Further, application of the present invention is not limited to a solid-state imaging device, but the present invention may be applied to an imaging device. The term "imaging device" represents an electronic apparatus having an imaging function, such as a camera system such as a digital still camera, a video camera, or the like, a cellular phone, or the like. In addition, the module form mounted on an electronic apparatus, i.e., a camera module, may be regarded as the imaging device.

11. Eleventh Embodiment

Electronic Apparatus

Figure 32:
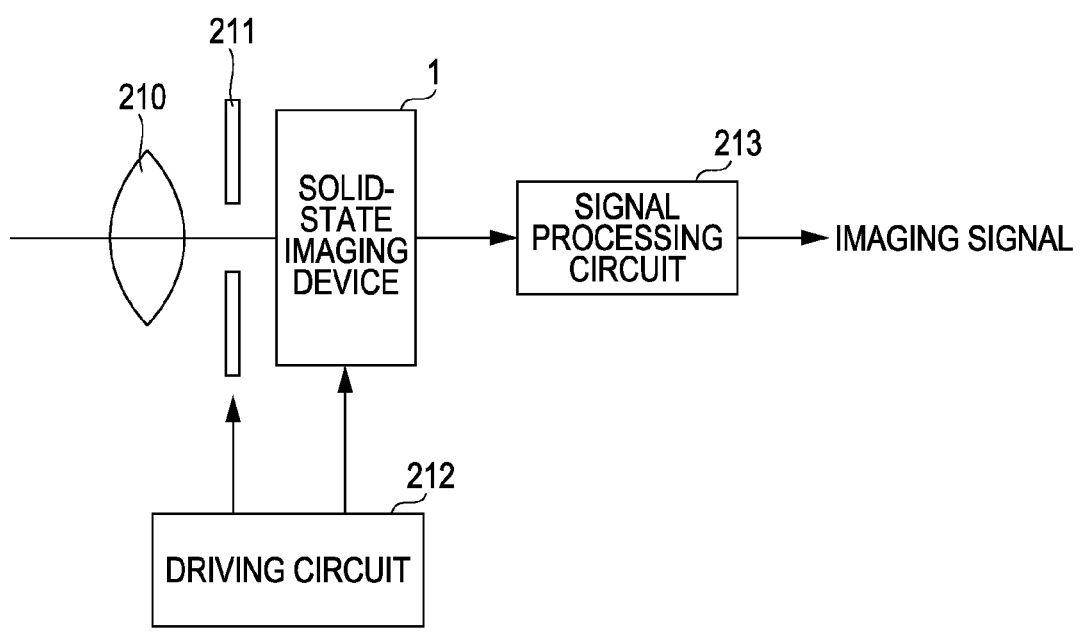
FIG. 32 is a schematic view of a configuration of an electronic apparatus according to an eleventh embodiment of the present invention.
Figure 33:
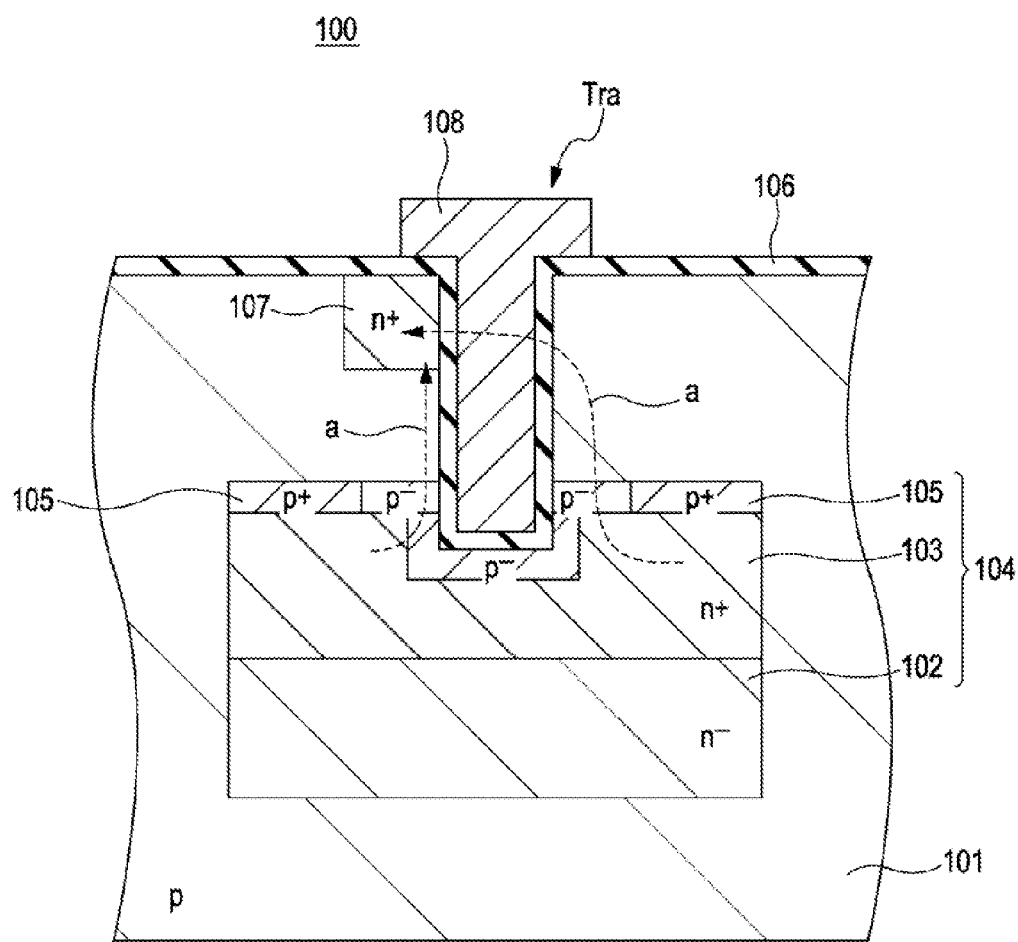
FIG. 33 is a schematic sectional view of a configuration of a solid-state imaging device of related art.

Next, an electronic apparatus according to an eleventh embodiment of the present invention is described. FIG. 32 is a schematic block diagram of the electronic apparatus according to the eleventh embodiment of the present invention.

The electronic apparatus according to the eleventh embodiment uses the solid-state imaging device 1 according to the first embodiment of the present invention.

The electronic apparatus according to the eleventh embodiment includes the solid-state imaging device 1, an optical lens 210, a shutter device 211, a driving circuit 212, and a signal processing circuit 213.

The optical lens 210 provides an image on an imaging surface of the solid-state imaging device 1 using image light (incident light) from an object. As a result, the signal charge is stored in the solid-state imaging device 1 for a predetermined time.

The shutter device 211 controls the light illumination time and the light shielding time for the solid-state imaging device 1.

The driving circuit 212 supplies a driving signal for controlling a transfer operation of the solid-state imaging device 1 and a shutter operation of the shutter device 211. In the solid-state imaging device 1, signals are transferred on the basis of the driving signal (timing signal) supplied from the driving circuit 212. The signal processing circuit 213 performs various types of signal processing. A video signal after signal processing is stored in a storage medium such as a memory or the like or output to a monitor.

In the electronic apparatus according to the eleventh embodiment, the solid-state imaging device 1 is capable of efficiently transferring signal charges while maintaining a high quantity (Qs) of saturation electric charge, thereby improving image quality.

The electronic apparatus to which the solid-state imaging device 1 may be applied is not limited to a camera as described above, but the solid-state imaging device 1 may be applied to an imaging device such as a digital still camera, a camera module for a mobile device such as a cellular phone or the like.

Although, in this embodiment, the solid-state imaging device 1 is used for the electronic apparatus, the solid-state imaging device according to any one of the above-described second to tenth embodiments may be used.

The present application contains subject matter related to that disclosed in Japanese Priority Patent Application JP 2009-174578 filed in the Japan Patent Office on Jul. 27, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a buried photodiode in a substrate;
a wiring layer over a surface of the substrate;
a trench portion in the substrate, the trench portion extending from the surface of the substrate down to a position at which a bottom of the trench portion is defined;
a buried floating diffusion in the substrate at the bottom of the trench portion;
a buried gate electrode in the trench portion and not overlapping the buried photodiode and the buried floating diffusion; and
an insulating layer between the buried gate electrode and the bottom of the trench portion.

2. The solid-state imaging device of claim 1, further comprising:
a wiring layer-side photodiode on the surface side of the substrate;
a wiring layer-side floating diffusion on the surface side of the substrate; and
a wiring layer-side gate electrode over the surface of the substrate in the wiring layer.

3. The solid-state imaging device of claim 2, wherein the buried gate electrode and the wiring layer-side gate electrode are integrally formed.

4. The solid-state imaging device of claim 3, wherein the buried gate electrode and the wiring layer-side gate electrode are connected to each other through a wiring formed on the surface side of the substrate.

5. The solid-state imaging device of claim 4, wherein the buried photodiode and the wiring layer-side photodiode produce signal charges from light at different wavelengths.

6. The solid-state imaging device of claim 5, further comprising an organic photoelectric conversion layer on a side of the semiconductor substrate on which light is incident to produce a signal charge by photoelectric conversion of light at a predetermined wavelength.

7. The solid-state imaging device of claim 2, wherein the wiring layer-side floating diffusion is common to adjacent pixels.

8. The solid-state imaging device according of claim 1, wherein the buried floating diffusion is common to adjacent pixels.

9. The solid-state imaging device of claim 1, wherein:
the solid-state imaging device includes a pixel having two or more buried photodiodes at different depths in the substrate, and
the buried floating diffusion and the buried gate electrode are provided for each of the buried photodiodes.

10. The solid-state imaging device of claim 1, wherein:
a pn junction of the buried photodiode is at a first depth from the surface of the substrate, and
the bottom of the trench portion is positioned at a second depth below the surface of the substrate, the second depth being equal to the first depth.

11. An electronic apparatus comprising:
(a) an optical lens;
(b) a solid-state imaging device on which light collected in the optical lens is incident, the solid-state imaging device including:
(i) a buried photodiode in a substrate;
(ii) a wiring layer over a surface of the substrate;
(iii) a trench portion in the substrate, the trench portion extending from the surface of the substrate down to a position at which a bottom of the trench portion is defined;
(iv) a buried floating diffusion in the substrate at the bottom of the trench portion;
(v) a buried gate electrode in the trench portion and not overlapping the buried photodiode and the buried floating diffusion; and
(vi) an insulating layer between the buried gate electrode and the bottom of the trench portion; and
(c) a signal processing circuit adapted to process a signal output from the solid-state imaging device.

12. The electronic apparatus of claim 11, further comprising:
a wiring layer-side photodiode on the surface side of the substrate;
a wiring layer-side floating diffusion on the surface side of the substrate; and
a wiring layer-side gate electrode over the surface of the substrate in the wiring layer.

13. The electronic apparatus of claim 12, wherein the buried gate electrode and the wiring layer-side gate electrode are integrally formed.

14. The electronic apparatus of claim 13, wherein the buried gate electrode and the wiring layer-side gate electrode are connected to each other through a wiring formed on the surface side of the substrate.

15. The electronic apparatus of claim 14, wherein the buried photodiode and the wiring layer-side photodiode produce signal charges from light at different wavelengths.

16. The electronic apparatus of claim 15, further comprising an organic photoelectric conversion layer on a side of the semiconductor substrate on which light is incident to produce a signal charge by photoelectric conversion of light at a predetermined wavelength.

17. The electronic apparatus of claim 11, wherein the buried floating diffusion is common to adjacent pixels.

18. The electronic apparatus of claim 12, wherein the wiring layer-side floating diffusion is common to adjacent pixels.

19. The electronic apparatus of claim 11, wherein:
the solid-state imaging device includes a pixel having two or more buried photodiodes at different depths in the substrate, and
the buried floating diffusion and the buried gate electrode are provided for each of the buried photodiodes.

20. The electronic apparatus of claim 11, wherein:
a pn junction of the buried photodiode is at a first depth from the surface of the substrate, and
the bottom of the trench portion is positioned at a second depth from the surface of the substrate, the second depth being equal to the first depth.

\* \* \* \* \*